(12) United States Patent
Russo et al.

(10) Patent No.: US 10,872,670 B2
(45) Date of Patent: Dec. 22, 2020

(54) METHODS FOR DETERMINING DATA STATES OF MEMORY CELLS

(71) Applicant: MICRON TECHNOLOGY, INC., Boise, ID (US)

(72) Inventors: Ugo Russo, Boise, ID (US); Violante Moschiano, Avezzano (IT); William C. Filipiak, Boise, ID (US); Andrea D'Alessandro, L'Aquila (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/221,765

(22) Filed: Dec. 17, 2018

(65) Prior Publication Data

US 2020/0194084 A1    Jun. 18, 2020

(51) Int. Cl.
| | |
|---|---|
| *G11C 16/10* | (2006.01) |
| *G11C 16/26* | (2006.01) |
| *G11C 16/34* | (2006.01) |
| *G11C 16/04* | (2006.01) |
| *G11C 5/14* | (2006.01) |
| *G11C 11/4074* | (2006.01) |
| *G11C 7/04* | (2006.01) |
| *G11C 11/56* | (2006.01) |

(52) U.S. Cl.
CPC ............. *G11C 16/26* (2013.01); *G11C 5/145* (2013.01); *G11C 5/147* (2013.01); *G11C 7/04* (2013.01); *G11C 11/4074* (2013.01); *G11C 11/5628* (2013.01); *G11C 16/0483* (2013.01); *G11C 16/10* (2013.01); *G11C 16/3459* (2013.01)

(58) Field of Classification Search
CPC ......... G11C 16/26; G11C 5/145; G11C 5/147; G11C 7/04; G11C 11/4074; G11C 11/5628; G11C 16/0483; G11C 16/10; G11C 16/3459
USPC ................................................... 365/230.03
See application file for complete search history.

(56) References Cited

U.S. PATENT DOCUMENTS

| | | | |
|---|---|---|---|
| 7,751,253 B2 | 7/2010 | Sarin et al. | |
| 7,768,832 B2 | 8/2010 | Roohparvar et al. | |
| 7,898,885 B2 | 3/2011 | Sarin et al. | |
| 8,169,830 B2 | 5/2012 | Moschiano et al. | |
| 10,062,441 B1 | 8/2018 | Vali et al. | |
| 10,127,988 B2 | 11/2018 | Vu et al. | |
| 2009/0310406 A1* | 12/2009 | Sarin | ................... G11C 11/5628 365/185.03 |
| 2011/0063918 A1* | 3/2011 | Pei | ....................... G06F 11/1072 365/185.18 |

* cited by examiner

*Primary Examiner* — Harry W Byrne
(74) *Attorney, Agent, or Firm* — Dicke, Billig & Czaja, PLLC

(57) ABSTRACT

Methods of operating a memory, and apparatus configured to perform similar methods, include determining a voltage level of a stepped sense operation that activates a memory cell of the memory during a programming operation for the memory cell, and determining a voltage level of a ramped sense operation that activates the memory cell during a read operation for the memory cell.

20 Claims, 15 Drawing Sheets

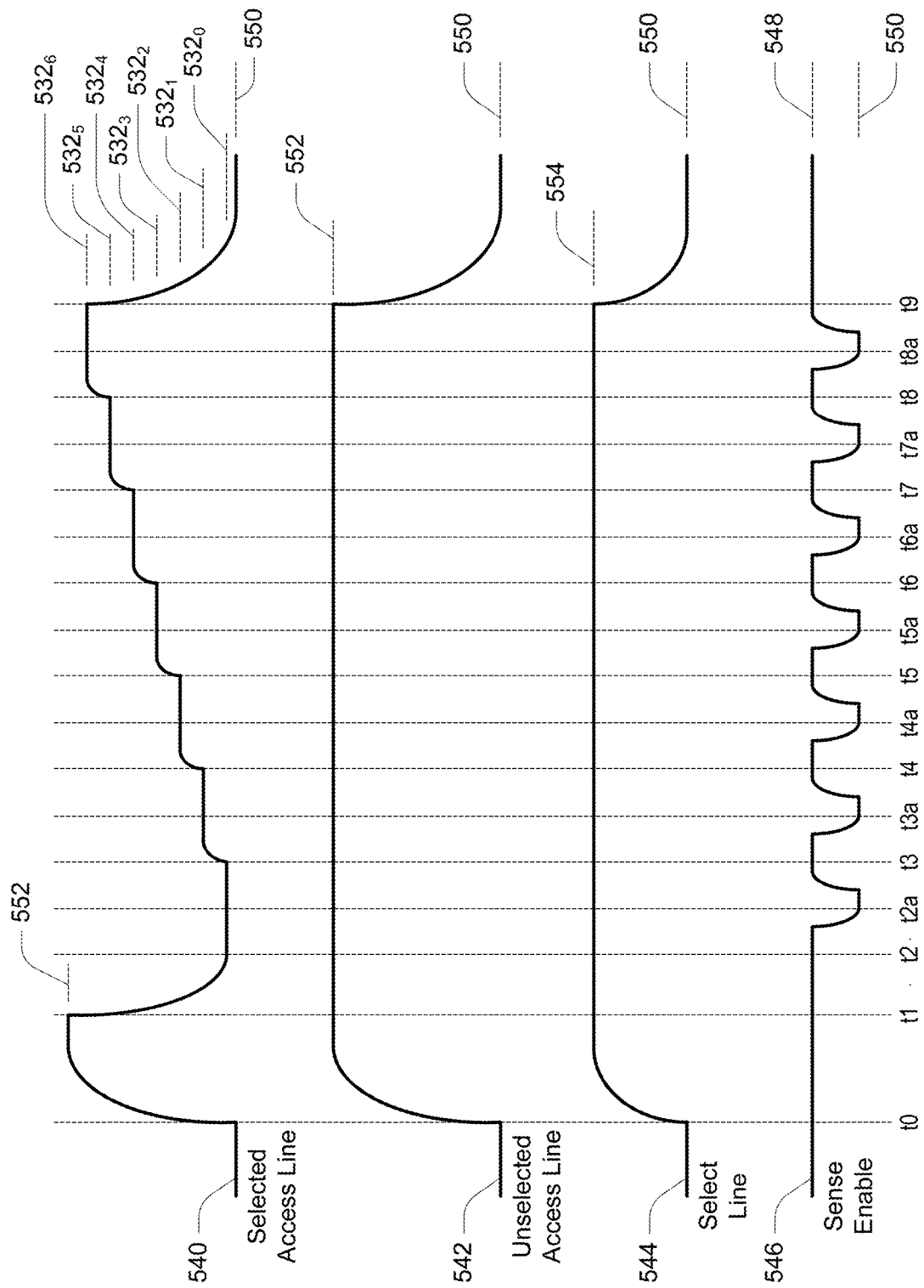

US 10,872,670 B2

METHODS FOR DETERMINING DATA STATES OF MEMORY CELLS

TECHNICAL FIELD

The present disclosure relates generally to memory and, in particular, in one or more embodiments, the present disclosure relates to apparatus and methods for determining data states of memory cells.

BACKGROUND

Memories (e.g., memory devices) are typically provided as internal, semiconductor, integrated circuit devices in computers or other electronic devices. There are many different types of memory including random-access memory (RAM), read only memory (ROM), dynamic random access memory (DRAM), synchronous dynamic random access memory (SDRAM), and flash memory.

Flash memory has developed into a popular source of non-volatile memory for a wide range of electronic applications. Flash memory typically use a one-transistor memory cell that allows for high memory densities, high reliability, and low power consumption. Changes in threshold voltage (Vt) of the memory cells, through programming (which is often referred to as writing) of charge storage structures (e.g., floating gates or charge traps) or other physical phenomena (e.g., phase change or polarization), determine the data state (e.g., data value) of each memory cell. Common uses for flash memory and other non-volatile memory include personal computers, personal digital assistants (PDAs), digital cameras, digital media players, digital recorders, games, appliances, vehicles, wireless devices, mobile telephones, and removable memory modules, and the uses for non-volatile memory continue to expand.

A NAND flash memory is a common type of flash memory device, so called for the logical form in which the basic memory cell configuration is arranged. Typically, the array of memory cells for NAND flash memory is arranged such that the control gate of each memory cell of a row of the array is connected together to form an access line, such as a word line. Columns of the array include strings (often termed NAND strings) of memory cells connected together in series between a pair of select gates, e.g., a source select transistor and a drain select transistor. Each source select transistor may be connected to a source, while each drain select transistor may be connected to a data line, such as column bit line. Variations using more than one select gate between a string of memory cells and the source, and/or between the string of memory cells and the data line, are known.

In programming memory, memory cells might be programmed as what are often termed single-level cells (SLC). SLC may use a single memory cell to represent one digit (e.g., one bit) of data. For example, in SLC, a Vt of 2.5V or higher might indicate a programmed memory cell (e.g., representing a logical 0) while a Vt of −0.5V or lower might indicate an erased memory cell (e.g., representing a logical 1). Such memory might achieve higher levels of storage capacity by including multi-level cells (MLC), triple-level cells (TLC), quad-level cells (QLC), etc., or combinations thereof in which the memory cell has multiple levels that enable more digits of data to be stored in each memory cell. For example, MLC might be configured to store two digits of data per memory cell represented by four Vt ranges, TLC might be configured to store three digits of data per memory cell represented by eight Vt ranges, QLC might be configured to store four digits of data per memory cell represented by sixteen Vt ranges, and so on.

Programming memory typically utilizes an iterative process of applying a programming pulse to a memory cell and verifying if that memory cell has reached its desired data state (e.g., corresponding to a target threshold voltage) in response to that programming pulse, and repeating that iterative process until that memory cell passes the verification. Once a memory cell passes the verification, it may be inhibited from further programming, although other memory cells may still be enabled for programming for subsequent programming pulses. The iterative process can be repeated with changing (e.g., increasing) voltage levels of the programming pulse until each memory cell selected for the programming operation has reached its respective desired data state, or some failure is declared, e.g., reaching a maximum number of allowed programming pulses during the programming operation.

Sensing (e.g., reading or verifying) a data state of a memory cell often involves detecting whether the memory cell is activated in response to a particular voltage applied to its control gate, such as by detecting a current flow or voltage change in a data line connected to the memory cell. As memory operation advances to represent additional data states per memory cell, the margins between adjacent Vt ranges can become smaller. This can lead to an inaccurate determination of the data state of a sensed memory cell if the Vt of the sensed memory cell shifts over time.

BRIEF DESCRIPTION OF THE DRAWINGS

FIGS. 5A-5B depict timing diagrams for methods of operating a memory in accordance with embodiments.

DETAILED DESCRIPTION

Figure 1:
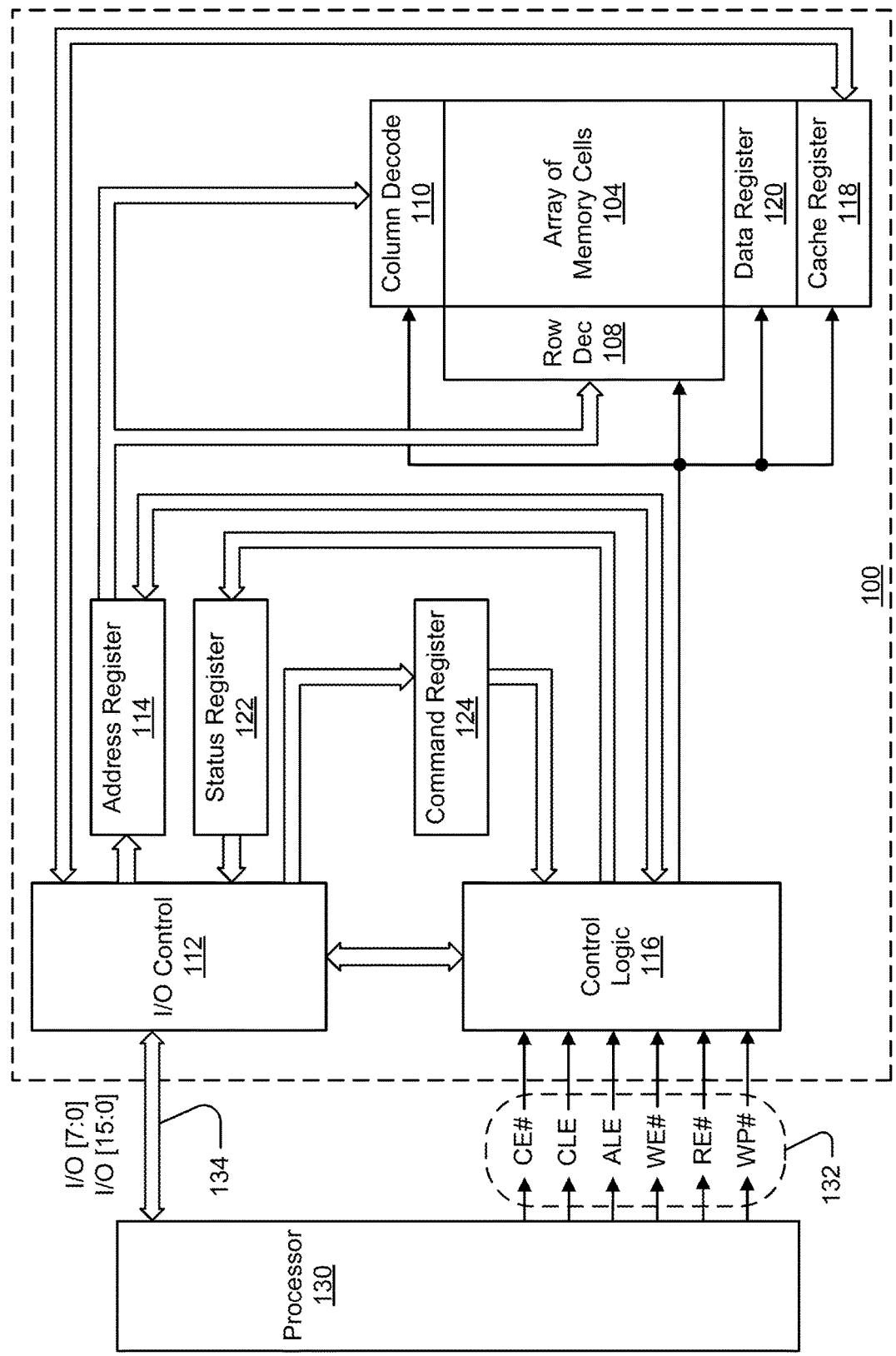
FIG. 1 is a simplified block diagram of a memory in communication with a processor as part of an electronic system, according to an embodiment.

In the following detailed description, reference is made to the accompanying drawings that form a part hereof, and in which is shown, by way of illustration, specific embodiments. In the drawings, like reference numerals describe substantially similar components throughout the several views. Other embodiments may be utilized and structural, logical and electrical changes may be made without departing from the scope of the present disclosure. The following detailed description is, therefore, not to be taken in a limiting sense.

The term "semiconductor" used herein can refer to, for example, a layer of material, a wafer, or a substrate, and includes any base semiconductor structure. "Semiconductor" is to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a semiconductor in the following description, previous process steps may have been utilized to form regions/junctions in the base semiconductor structure, and the term semiconductor can include the underlying layers containing such regions/junctions. The term conductive as used herein, as well as its various related forms, e.g., conduct, conductively, conducting, conduction, conductivity, etc., refers to electrically conductive unless otherwise apparent from the context. Similarly, the term connecting as used herein, as well as its various related forms, e.g., connect, connected, connection, etc., refers to electrically connecting unless otherwise apparent from the context.

FIG. 1 is a simplified block diagram of a first apparatus, in the form of a memory (e.g., memory device) 100, in communication with a second apparatus, in the form of a processor 130, as part of a third apparatus, in the form of an electronic system, according to an embodiment. Some examples of electronic systems include personal computers, personal digital assistants (PDAs), digital cameras, digital media players, digital recorders, games, appliances, vehicles, wireless devices, mobile telephones and the like. The processor 130, e.g., a controller external to the memory device 100, may be a memory controller or other external host device.

Memory device 100 includes an array of memory cells 104 logically arranged in rows and columns. Memory cells of a logical row are typically connected to the same access line (commonly referred to as a word line) while memory cells of a logical column are typically selectively connected to the same data line (commonly referred to as a bit line). A single access line may be associated with more than one logical row of memory cells and a single data line may be associated with more than one logical column. Memory cells (not shown in FIG. 1) of at least a portion of array of memory cells 104 are capable of being programmed to one of at least two data states.

A row decode circuitry 108 and a column decode circuitry 110 are provided to decode address signals. Address signals are received and decoded to access the array of memory cells 104. Memory device 100 also includes input/output (I/O) control circuitry 112 to manage input of commands, addresses and data to the memory device 100 as well as output of data and status information from the memory device 100. An address register 114 is in communication with I/O control circuitry 112 and row decode circuitry 108 and column decode circuitry 110 to latch the address signals prior to decoding. A command register 124 is in communication with I/O control circuitry 112 and control logic 116 to latch incoming commands. The control logic 116 might be configured to perform methods of operating a memory in accordance with embodiments.

A controller (e.g., the control logic 116 internal to the memory device 100) controls access to the array of memory cells 104 in response to the commands and generates status information for the external processor 130, i.e., control logic 116 is configured to perform access operations (e.g., read operations, programming operations and/or erase operations) on the array of memory cells 104. The control logic 116 is in communication with row decode circuitry 108 and column decode circuitry 110 to control the row decode circuitry 108 and column decode circuitry 110 in response to the addresses.

Control logic 116 is also in communication with a cache register 118. Cache register 118 latches data, either incoming or outgoing, as directed by control logic 116 to temporarily store data while the array of memory cells 104 is busy writing or reading, respectively, other data. During a programming operation (e.g., write operation), data may be passed from the cache register 118 to the data register 120 for transfer to the array of memory cells 104; then new data may be latched in the cache register 118 from the I/O control circuitry 112. During a read operation, data may be passed from the cache register 118 to the I/O control circuitry 112 for output to the external processor 130; then new data may be passed from the data register 120 to the cache register 118. The cache register 118 and/or the data register 120 may form (e.g., may form a portion of) a page buffer of the memory device 100. A page buffer may further include sensing devices (not shown in FIG. 1) to sense a data state of a memory cell of the array of memory cells 104, e.g., by sensing a state of a data line connected to that memory cell. A status register 122 may be in communication with I/O control circuitry 112 and control logic 116 to latch the status information for output to the processor 130.

Memory device 100 receives control signals at control logic 116 from processor 130 over a control link 132. The control signals might include a chip enable CE #, a command latch enable CLE, an address latch enable ALE, a write enable WE #, a read enable RE #, and a write protect WP #. Additional or alternative control signals (not shown) may be further received over control link 132 depending upon the nature of the memory device 100. Memory device 100 receives command signals (which represent commands), address signals (which represent addresses), and data signals (which represent data) from processor 130 over a multiplexed input/output (I/O) bus 134 and outputs data to processor 130 over I/O bus 134.

For example, the commands may be received over input/output (I/O) pins [7:0] of I/O bus 134 at I/O control circuitry 112 and may then be written into command register 124. The addresses may be received over input/output (I/O) pins [7:0] of I/O bus 134 at I/O control circuitry 112 and may then be written into address register 114. The data may be received over input/output (I/O) pins [7:0] for an 8-bit device or input/output (I/O) pins [15:0] for a 16-bit device at I/O control circuitry 112 and then may be written into cache register 118. The data may be subsequently written into data register 120 for programming the array of memory cells 104. For another embodiment, cache register 118 may be omitted, and the data may be written directly into data register 120. Data may also be output over input/output (I/O) pins [7:0] for an 8-bit device or input/output (I/O) pins [15:0] for a 16-bit device.

It will be appreciated by those skilled in the art that additional circuitry and signals can be provided, and that the memory device 100 of FIG. 1 has been simplified. It should be recognized that the functionality of the various block components described with reference to FIG. 1 may not necessarily be segregated to distinct components or component portions of an integrated circuit device. For example, a single component or component portion of an integrated circuit device could be adapted to perform the functionality of more than one block component of FIG. 1. Alternatively, one or more components or component portions of an integrated circuit device could be combined to perform the functionality of a single block component of FIG. 1.

Additionally, while specific I/O pins are described in accordance with popular conventions for receipt and output of the various signals, it is noted that other combinations or numbers of I/O pins (or other I/O node structures) may be used in the various embodiments.

Figure 2A:
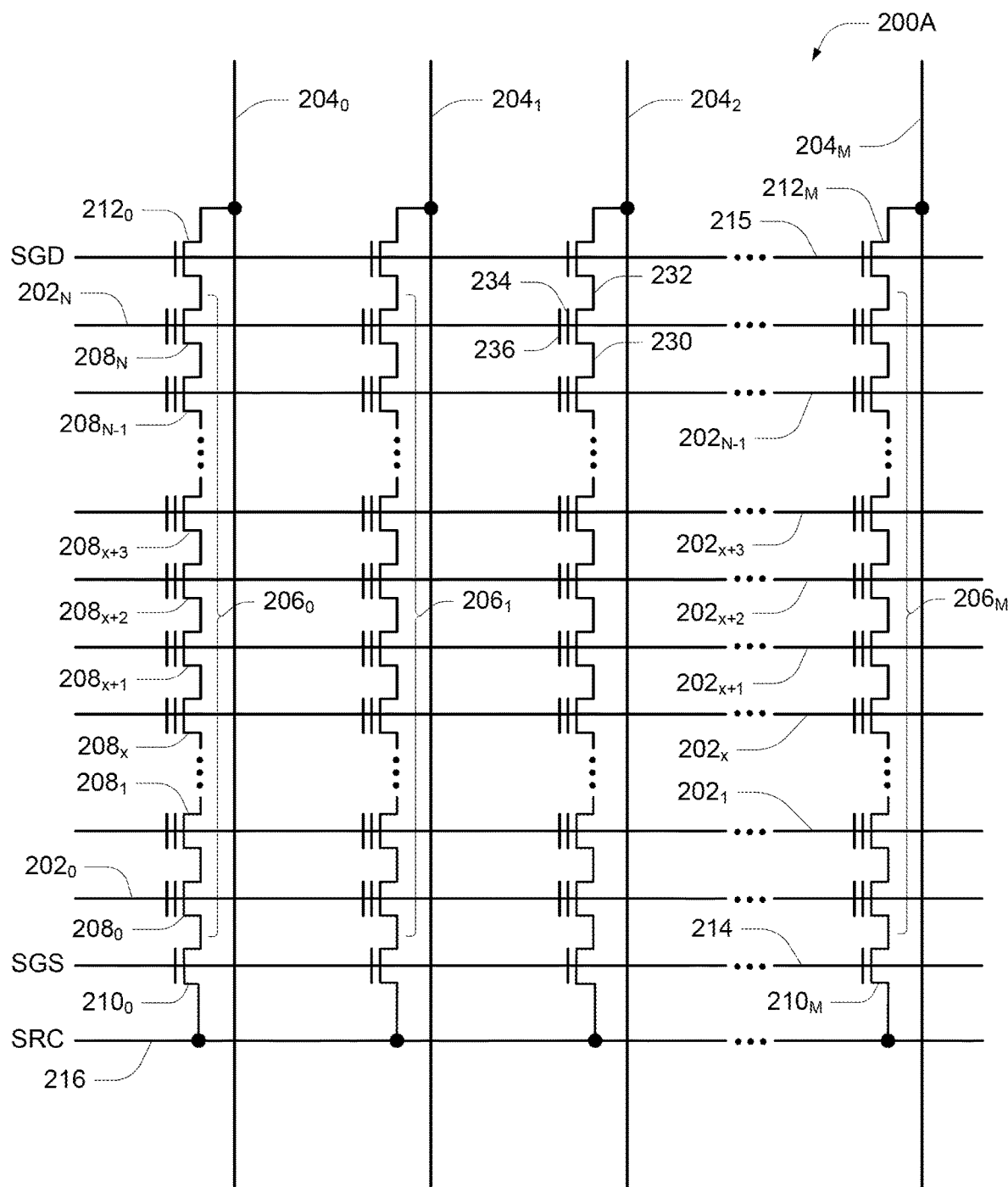
FIGS. 2A-2C are schematics of portions of an array of memory cells as could be used in a memory of the type described with reference to FIG. 1.

FIG. 2A is a schematic of a portion of an array of memory cells 200A, such as a NAND memory array, as could be used in a memory of the type described with reference to FIG. 1, e.g., as a portion of array of memory cells 104. Memory array 200A includes access lines, such as word lines $202_0$ to $202_N$, and data lines, such as bit lines $204_0$ to $204_M$. The word lines 202 may be connected to global access lines (e.g., global word lines), not shown in FIG. 2A, in a many-to-one relationship. For some embodiments, memory array 200A may be formed over a semiconductor that, for example, may be conductively doped to have a conductivity type, such as a p-type conductivity, e.g., to form a p-well, or an n-type conductivity, e.g., to form an n-well.

Memory array 200A might be arranged in rows (each corresponding to a word line 202) and columns (each corresponding to a bit line 204). Each column may include a string of series-connected memory cells (e.g., non-volatile memory cells), such as one of NAND strings $206o$ to $206M$. Each NAND string 206 might be connected (e.g., selectively connected) to a common source (SRC) 216 and might include memory cells $208_0$ to $208_N$. The memory cells 208 may represent non-volatile memory cells for storage of data. The memory cells 208 of each NAND string 206 might be connected in series between a select gate 210 (e.g., a field-effect transistor), such as one of the select gates $210_0$ to $210_M$ (e.g., that may be source select transistors, commonly referred to as select gate source), and a select gate 212 (e.g., a field-effect transistor), such as one of the select gates $212_0$ to $212_M$ (e.g., that may be drain select transistors, commonly referred to as select gate drain). Select gates $210_0$ to $210_M$ might be commonly connected to a select line 214, such as a source select line (SGS), and select gates $212_0$ to $212_M$ might be commonly connected to a select line 215, such as a drain select line (SGD). Although depicted as traditional field-effect transistors, the select gates 210 and 212 may utilize a structure similar to (e.g., the same as) the memory cells 208. The select gates 210 and 212 might represent a plurality of select gates connected in series, with each select gate in series configured to receive a same or independent control signal.

A source of each select gate 210 might be connected to common source 216. The drain of each select gate 210 might be connected to a memory cell $208_0$ of the corresponding NAND string 206. For example, the drain of select gate $210_0$ might be connected to memory cell $208_0$ of the corresponding NAND string $206_0$. Therefore, each select gate 210 might be configured to selectively connect a corresponding NAND string 206 to common source 216. A control gate of each select gate 210 might be connected to select line 214.

The drain of each select gate 212 might be connected to the bit line 204 for the corresponding NAND string 206. For example, the drain of select gate $212_0$ might be connected to the bit line $204_0$ for the corresponding NAND string $206_0$. The source of each select gate 212 might be connected to a memory cell $208_N$ of the corresponding NAND string 206. For example, the source of select gate $212_0$ might be connected to memory cell $208_N$ of the corresponding NAND string $206_0$. Therefore, each select gate 212 might be configured to selectively connect a corresponding NAND string 206 to the corresponding bit line 204. A control gate of each select gate 212 might be connected to select line 215.

The memory array in FIG. 2A might be a quasi-two-dimensional memory array and might have a generally planar structure, e.g., where the common source 216, NAND strings 206 and bit lines 204 extend in substantially parallel planes. Alternatively, the memory array in FIG. 2A might be a three-dimensional memory array, e.g., where NAND strings 206 may extend substantially perpendicular to a plane containing the common source 216 and to a plane containing the bit lines 204 that may be substantially parallel to the plane containing the common source 216.

Typical construction of memory cells 208 includes a data-storage structure 234 (e.g., a floating gate, charge trap, etc.) that can determine a data state of the memory cell (e.g., through changes in threshold voltage), and a control gate 236, as shown in FIG. 2A. The data-storage structure 234 may include both conductive and dielectric structures while the control gate 236 is generally formed of one or more conductive materials. In some cases, memory cells 208 may further have a defined source/drain (e.g., source) 230 and a defined source/drain (e.g., drain) 232. Memory cells 208 have their control gates 236 connected to (and in some cases form) a word line 202.

A column of the memory cells 208 may be a NAND string 206 or a plurality of NAND strings 206 selectively connected to a given bit line 204. A row of the memory cells 208 may be memory cells 208 commonly connected to a given word line 202. A row of memory cells 208 can, but need not, include all memory cells 208 commonly connected to a given word line 202. Rows of memory cells 208 may often be divided into one or more groups of physical pages of memory cells 208, and physical pages of memory cells 208 often include every other memory cell 208 commonly connected to a given word line 202. For example, memory cells 208 commonly connected to word line $202_N$ and selectively connected to even bit lines 204 (e.g., bit lines $204_0$, $204_2$, $204_4$, etc.) may be one physical page of memory cells 208 (e.g., even memory cells) while memory cells 208 commonly connected to word line $202_N$ and selectively connected to odd bit lines 204 (e.g., bit lines $204_1$, $204_3$, $204_5$, etc.) may be another physical page of memory cells 208 (e.g., odd memory cells). Although bit lines $204_3$-$204_5$ are not explicitly depicted in FIG. 2A, it is apparent from the figure that the bit lines 204 of the array of memory cells 200A may be numbered consecutively from bit line $204_0$ to bit line $204_M$. Other groupings of memory cells 208 commonly connected to a given word line 202 may also define a physical page of memory cells 208. For certain memory devices, all memory cells commonly connected to a given word line might be deemed a physical page of memory cells. The portion of a physical page of memory cells (which, in some embodiments, could still be the entire row) that is read during a single read operation or programmed during a single programming operation (e.g., an upper or lower page of memory cells) might be deemed a logical page of memory cells. A block of memory cells may include those memory cells that are configured to be erased together, such as all memory cells connected to word lines $202_0$-$202_N$ (e.g., all NAND strings 206 sharing common word lines 202). Unless expressly distinguished, a reference to a page of memory cells herein refers to the memory cells of a logical page of memory cells.

Although the example of FIG. 2A is discussed in conjunction with NAND flash, the embodiments and concepts described herein are not limited to a particular array architecture or structure, and can include other structures (e.g., SONOS, phase change, ferroelectric, etc.) and other architectures (e.g., AND arrays, NOR arrays, etc.).

Figure 2B:
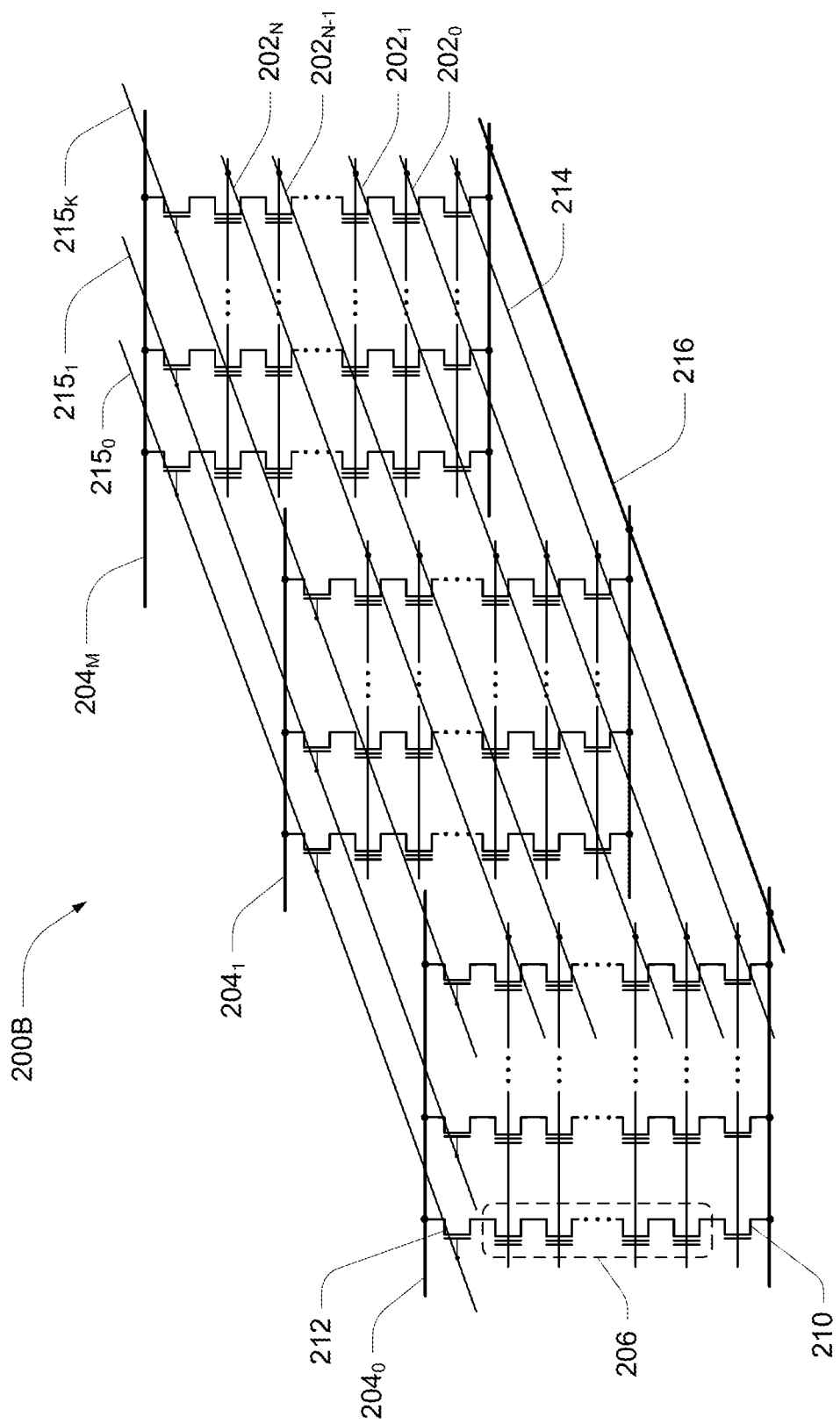

FIG. 2B is another schematic of a portion of an array of memory cells 200B as could be used in a memory of the type described with reference to FIG. 1, e.g., as a portion of array of memory cells 104. Like numbered elements in FIG. 2B correspond to the description as provided with respect to FIG. 2A. FIG. 2B provides additional detail of one example of a three-dimensional NAND memory array structure. The three-dimensional NAND memory array 200B may incorporate vertical structures which may include semiconductor pillars where a portion of a pillar may act as a channel region of the memory cells of NAND strings 206. The NAND strings 206 may be each selectively connected to a bit line $204_0$-$204_M$ by a select transistor 212 (e.g., that may be drain select transistors, commonly referred to as select gate drain) and to a common source 216 by a select transistor 210 (e.g., that may be source select transistors, commonly referred to as select gate source). Multiple NAND strings 206 might be selectively connected to the same bit line 204. Subsets of NAND strings 206 can be connected to their respective bit lines 204 by biasing the select lines $215_0$-$215_K$ to selectively activate particular select transistors 212 each between a NAND string 206 and a bit line 204. The select transistors 210 can be activated by biasing the select line 214. Each word line 202 may be connected to multiple rows of memory cells of the memory array 200B. Rows of memory cells that are commonly connected to each other by a particular word line 202 may collectively be referred to as tiers.

Figure 2C:
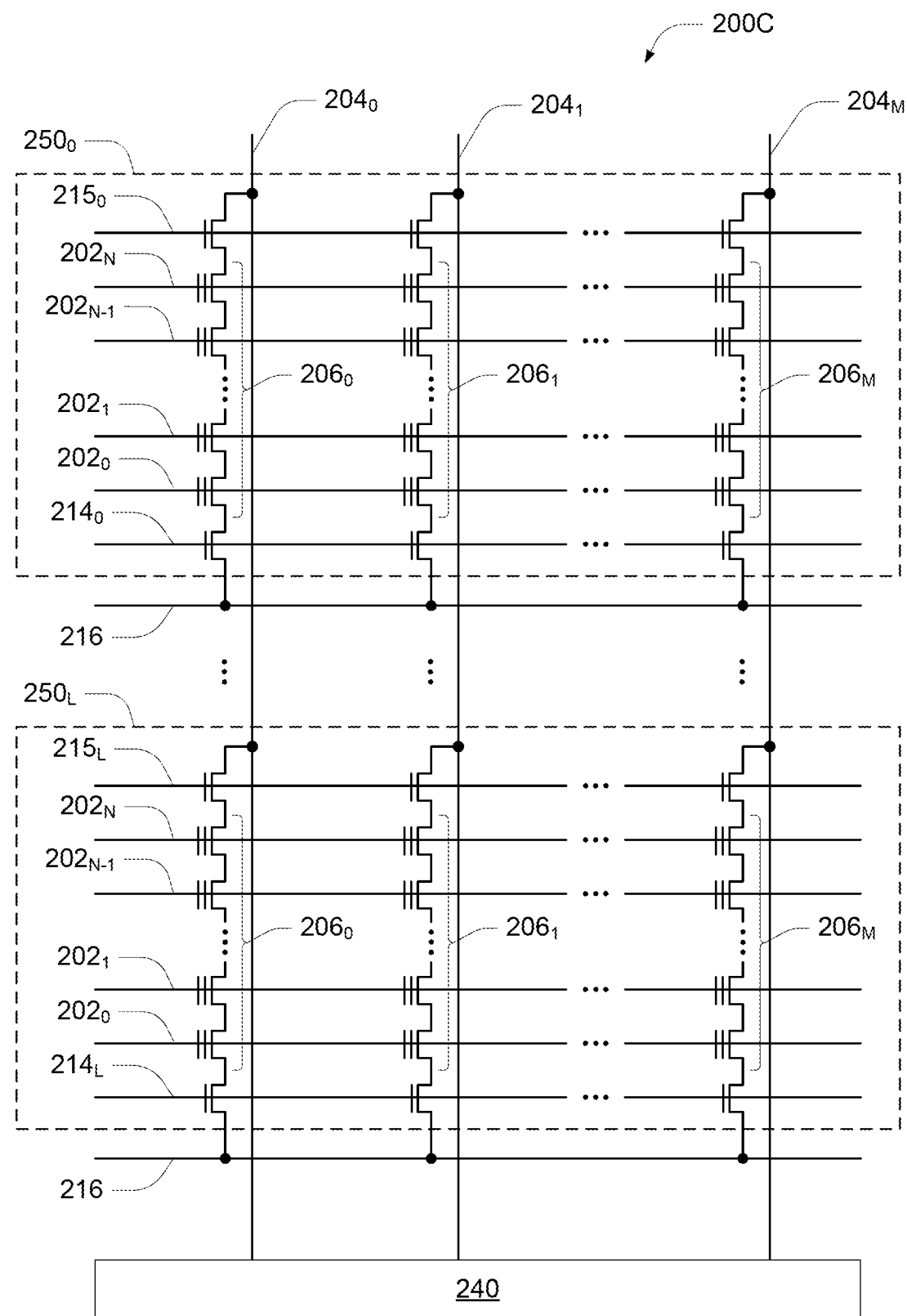

FIG. 2C is a further schematic of a portion of an array of memory cells 200C as could be used in a memory of the type described with reference to FIG. 1, e.g., as a portion of array of memory cells 104. Like numbered elements in FIG. 2C correspond to the description as provided with respect to FIG. 2A. Array of memory cells 200C may include strings of series-connected memory cells (e.g., NAND strings) 206, access (e.g., word) lines 202, data (e.g., bit) lines 204, select lines 214 (e.g., source select lines), select lines 215 (e.g., drain select lines) and source 216 as depicted in FIG. 2A. A portion of the array of memory cells 200A may be a portion of the array of memory cells 200C, for example. FIG. 2C depicts groupings of NAND strings 206 into blocks of memory cells 250. Blocks of memory cells 250 may be groupings of memory cells 208 that may be erased together in a single erase operation, sometimes referred to as erase blocks. Each block of memory cells 250 might represent those NAND strings 206 commonly associated with a single select line 215, e.g., select line $215_0$. The source 216 for the block of memory cells $250_0$ might be a same source as the source 216 for the block of memory cells $250_L$. For example, each block of memory cells $250_0$-$250_L$ might be commonly selectively connected to the source 216. Access lines 202 and select lines 214 and 215 of one block of memory cells 250 may have no direct connection to access lines 202 and select lines 214 and 215, respectively, of any other block of memory cells of the blocks of memory cells $250_0$-$250_L$.

The data lines $204_0$-$204_M$ may be connected (e.g., selectively connected) to a buffer portion 240, which might be a portion of a page buffer of the memory. The buffer portion 240 might correspond to a memory plane (e.g., the set of blocks of memory cells $250_0$-$250_L$). The buffer portion 240 might include sensing devices (not shown in FIG. 2C) for sensing data values indicated on respective data lines 204, and corresponding registers (not shown in FIG. 2C) for storage of the sensed data values from its corresponding memory plane.

Figure 3:
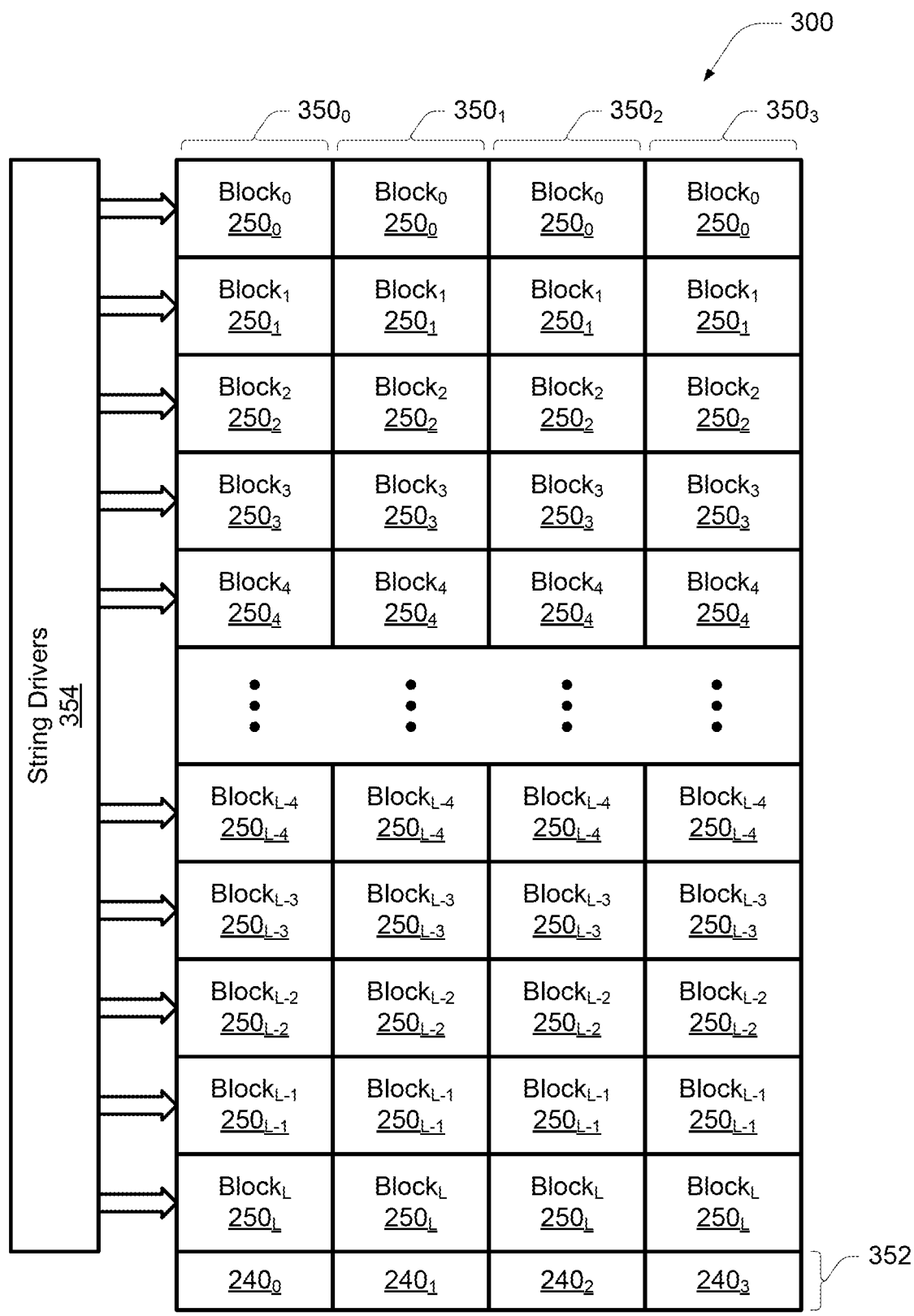
FIG. 3 is a block schematic of a portion of an array of memory cells as could be used in a memory of the type described with reference to FIG. 1.

FIG. 3 is a block schematic of a portion of an array of memory cells as could be used in a memory of the type described with reference to FIG. 1. The array of memory cells 300 is depicted to have four memory planes 350 (e.g., memory planes $350_0$-$350_3$), each in communication with a respective buffer portion 240, which might collectively form a page buffer 352. While four memory planes 350 are depicted, other numbers of memory planes 350 might be commonly in communication with a page buffer 352. Each memory plane 350 is depicted to include L+1 blocks of memory cells 250 (e.g., blocks of memory cells $250_0$-$250_L$).

Each memory plane 350 might be connected to string drivers 354 to apply the various voltage levels to the respective access lines and select lines of the blocks of memory cells 250 for performing access operations. The string drivers 354 might be a part of the row decode circuitry 108 of FIG. 1. A set of voltage levels received by one block of memory cells, e.g., block of memory cells $250_0$, might be different than a set of voltage levels received by another block of memory cells, e.g., block of memory cells $250_1$. Blocks of memory cells of a particular tier, e.g., blocks of memory cells $250_0$ of all memory planes $350_0$-$350_3$, may each receive a same set of voltage levels to their access lines. In addition, a corresponding access line for each block of memory cells of a particular tier, e.g., an access line $202_x$ (FIG. 2A) for the blocks of memory $250_0$ of all memory planes 350, may be a contiguous conductive structure. Accordingly, a distance (e.g., a length of an access line) from the string drivers 354 increases from memory plane $350_0$ to memory plane $350_3$.

Figure 4A:
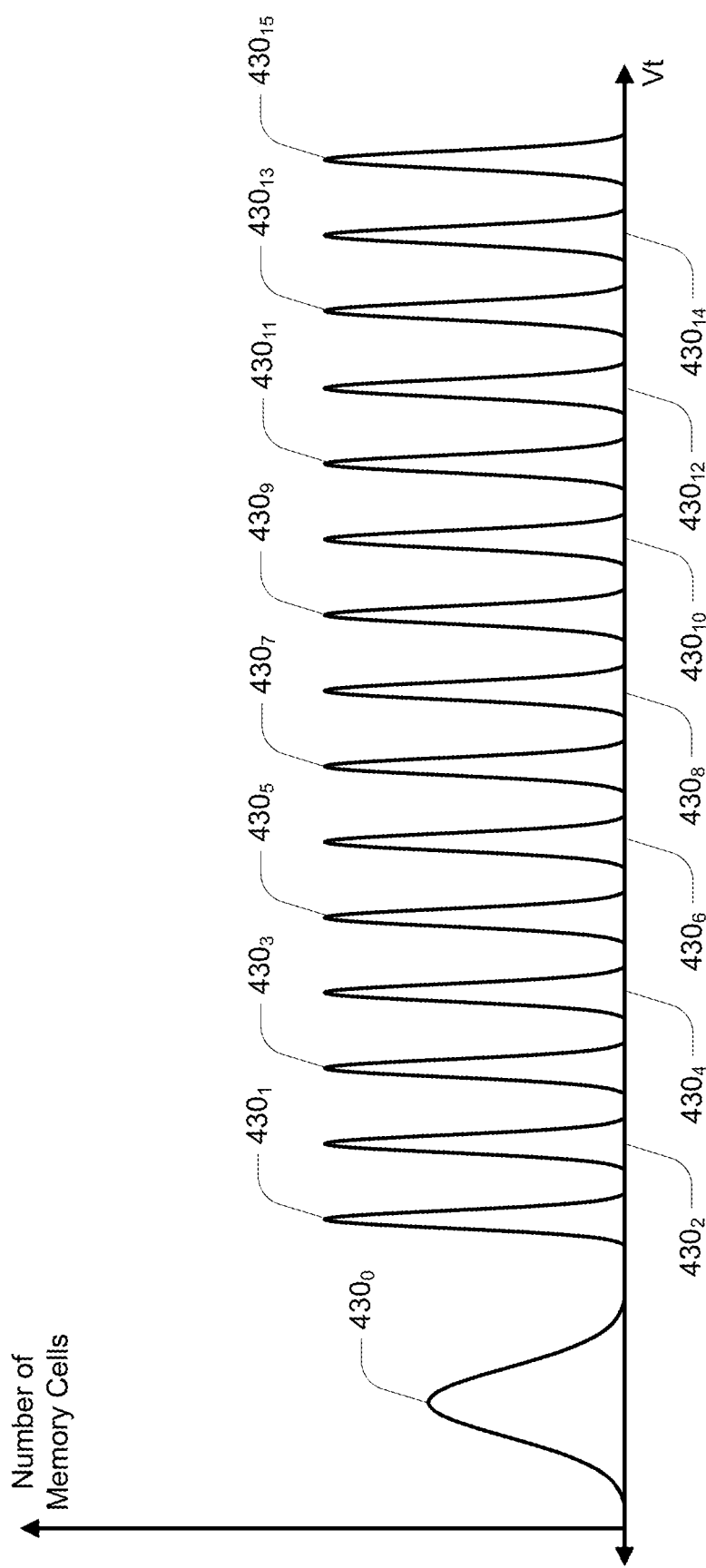
FIGS. 4A-4B are conceptual depictions of threshold voltage distributions of a plurality of memory cells as could be used with embodiments.
Figure 4B:
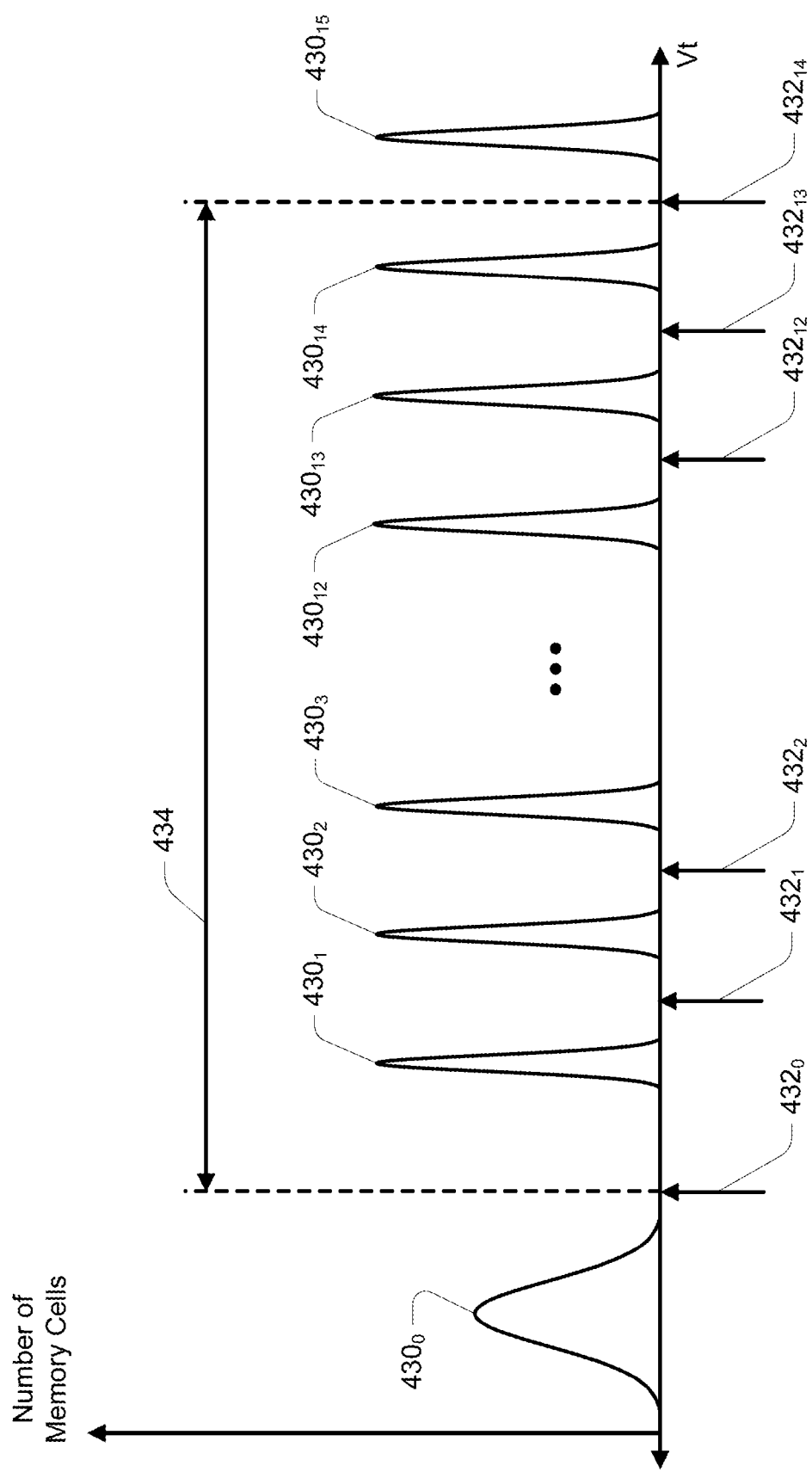

FIGS. 4A-4B are conceptual depictions of threshold voltage distributions of a plurality of memory cells as could be used with embodiments. FIG. 4A illustrates an example of threshold voltage ranges and their distributions for a population of sixteen-level memory cells, often referred to as QLC memory cells. For example, such a memory cell might be programmed to a threshold voltage (Vt) that falls within one of sixteen different threshold voltage ranges $430_0$-$430_{15}$, each being used to represent a data state corresponding to a bit pattern of four bits. The threshold voltage range $430_0$ typically has a greater width than the remaining threshold voltage ranges $430_1$-$430_{15}$ as memory cells are generally all placed in the data state corresponding to the threshold voltage range $430_0$, then subsets of those memory cells are subsequently programmed to have threshold voltages in one of the threshold voltage ranges $430_1$-$430_{15}$. As programming operations are generally more incrementally controlled than erase operations, these threshold voltage ranges $430_1$-$430_{15}$ may tend to have tighter distributions.

The threshold voltage ranges $430_0$, $430_1$, $430_2$, $430_3$, $430_4$, $430_5$, $430_6$, $430_7$, $430_8$, $430_9$, $430_{10}$, $430_{11}$, $430_{12}$, $430_{13}$, $430_{14}$ and $430_{15}$ might each represent a respective data state, e.g., L0, L1, L2, L3, L4, L5, L6, L7, L8, L9, L10, L11, L12, L13, L14 and L15, respectively. As an example, if the threshold voltage of a memory cell is within the first of the sixteen threshold voltage ranges $430_0$, the memory cell in this case may be storing a data state L0 having a data value of logical '1111' and is typically referred to as the erased state of the memory cell. If the threshold voltage is within the second of the sixteen threshold voltage ranges $430_1$, the memory cell in this case may be storing a data state L1 having a data value of logical '0111'. If the threshold voltage is within the third of the sixteen threshold voltage ranges $430_2$, the memory cell in this case may be storing a data state L2 having a data value of logical '0011', and so on. Table 1 provides one possible correspondence between the data states and their corresponding logical data values for a QLC memory cell. Other assignments of data states to logical data values are known. Memory cells remaining in the lowest data state (e.g., the erased state or L0 data state), as used herein, will be deemed to be programmed to the lowest data state.

TABLE 1

| Data State | Logical Data Value |
| --- | --- |
| L0 | 1111 |
| L1 | 0111 |
| L2 | 0011 |
| L3 | 1011 |
| L4 | 1001 |
| L5 | 0001 |
| L6 | 0101 |
| L7 | 1101 |
| L8 | 1100 |
| L9 | 0100 |
| L10 | 0000 |
| L11 | 1000 |
| L12 | 1010 |
| L13 | 0010 |
| L14 | 0110 |
| L15 | 1110 |

In determining the data states of the memory cells of the various distributions of FIG. 4A, discrete or stepped sense voltages (e.g., verify voltages or read voltages) $432_0$-$432_{14}$ might be used as depicted in FIG. 4B (e.g., for program verify operations or read operations, respectively). For example, where the sense voltages 432 are applied in increasing order to an access line, memory cells first activating in response to the sense voltage $432_0$ might be determined to have the data state corresponding to the threshold voltage range $430_0$, memory cells first activating in response to the sense voltage $432_1$ might be determined to have the data state corresponding to the threshold voltage range $430_1$, memory cells first activating in response to the sense voltage $432_2$ might be determined to have the data state corresponding to the threshold voltage range $430_2$, and so on. Memory cells that do not activate in response to any of the sense voltages $432_0$-$432_{14}$ might be deemed to have the data state corresponding to the threshold voltage range $430_{15}$. The voltage range between the highest sense voltage and the lowest sense voltage of the read operation might represent a read window 434. Immediately subsequent to programming the memory cells, the read window 434, e.g., an initial read window, might be approximately 6 V, and range from approximately −1 V to 5 V, for example.

Alternatively, a ramped sense voltage could be applied to an access line. It might then be determined at what voltage level of the ramped sense voltage a memory cell was deemed to be activated. This determined voltage level (or a representation thereof) might then be used to determine the data state of the memory cell, such as by comparing the determined voltage level to the discrete sense voltages $432_0$-$432_{14}$ (or representations thereof). Sense voltages 432 used for a stepped sense voltage may be different than sense voltages 432 for a ramped sense voltage. For example, while they might utilize a same initial sense voltage, a highest sense voltage for ramped sensing may be higher than a highest sense voltage for stepped sensing, resulting in a larger read window in ramped sensing.

Ramped sensing, with its more granular determination of a voltage level resulting in activation of a memory cell, may provide advantages over stepped sensing for memory cells experiencing charge loss over time. For example, for similar memory cells, ramped sensing might provide a trigger rate in the presence of time-dependent charge loss that is more than three orders of magnitude longer than stepped sensing due to improved error correction capabilities. However, ramped sensing may measure an artificially high threshold voltage for memory cells that are farther from the string drivers 354 as a result of the RC time constant of the access line 202. Because memory cells farther from the string drivers 354 experience a lower drive voltage level than memory cells nearer the string drivers 354 at any particular time, the far memory cells may experience lower levels of voltage stress relative to the near memory cells for a same pass voltage. Because the read disturb capability (e.g., number of reads before failure) generally decreases exponentially with increasing voltage stress, the impact of ramped sensing on read disturb can be severe. For example, for similar memory cells, stepped sensing might provide a read disturb capability that is more than two orders of magnitude greater than ramped sensing.

Various embodiments seek to retain benefits of ramped sensing in the presence of time-dependent charge loss while mitigating its impact on read disturb. In particular, stepped sensing might be utilized during program verify operations, while ramped sensing might be used for read operations. However, differences between the two sensing schemes intrinsically introduce sources of mismatch between the threshold voltage determined at program verify versus the threshold voltage at read. For example, because stepped sensing might hold access line voltages long enough to allow the entire access line to come to a steady-state voltage, there may be a broadening of the threshold voltage distributions due to the effects of RC time constant in ramped sensing and the resulting difference in voltage levels along the length of the access line. In addition, stepped sensing and ramped sensing might utilize different sense circuitry, leading to further mismatches. Accordingly, embodiments might utilize a correction to compensate for the differences in the sensing schemes.

Figure 5B:
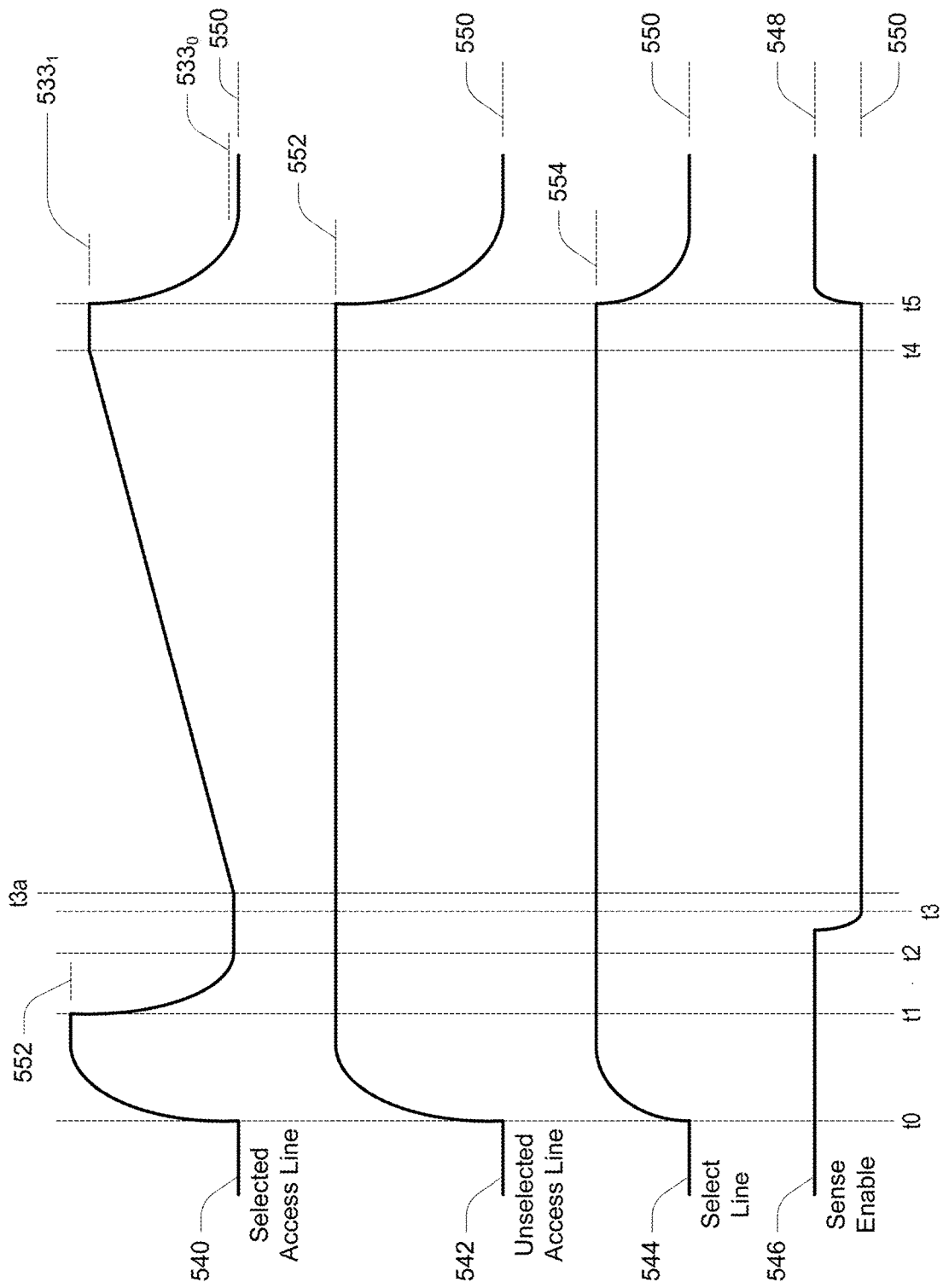

FIGS. 5A-5B depict timing diagrams for methods of operating a memory in accordance with embodiments. For example, the timing diagrams of FIGS. 5A and 5B might each represent a sense operation of a memory. FIG. 5A might represent a sense operation (e.g., a program verify operation) using a stepped sense voltage (e.g., a stepped verify voltage), while FIG. 5B might represent a sense operation (e.g., a read operation) using a ramped sense voltage (e.g., a ramped read voltage). FIGS. 5A and 5B will each presume a sense operation for TLC memory cells, e.g., eight-level memory cells representing data states L0, L1, L2, L3, L4, L5, L6 and L7 using eight threshold voltage ranges, each representing a data state corresponding to a bit pattern of three bits. Table 2 provides one possible correspondence between the data states and their corresponding logical data values for a TLC memory cell. Other assignments of data states to logical data values are known. Memory cells remaining in the lowest data state (e.g., the erased state or L0 data state), as used herein, will be deemed to be programmed to the lowest data state.

TABLE 2

| Data State | Logical Data Value |
|---|---|
| L0 | 111 |
| L1 | 011 |
| L2 | 001 |
| L3 | 101 |
| L4 | 100 |
| L5 | 000 |
| L6 | 010 |
| L7 | 110 |

In FIG. 5A, trace 540 might represent the voltage level applied to an access line connected to a memory cell selected for the sense operation, e.g., a target memory cell. The following discussion will be made with reference to at least FIG. 2A and will presume that the memory cell selected for the sense operation is the memory cell $208_x$ of the NAND string $206_0$, such that trace 540 might represent the voltage level applied to access line $202_x$. The access line $202_x$ may be referred to as the selected access line as it contains the target memory cell, while remaining access lines 202 may be referred to as unselected access lines. The NAND string $206_0$ may be referred to as the selected string of series-connected memory cells as it contains the target memory cell. Trace 542 might represent the voltage level applied to one or more of the unselected access lines 202, e.g., access lines $202_0$-$202_{x-1}$ and $202_{x+1}$-$202_N$. Trace 544 might represent the voltage level applied to the select line 214 and/or the voltage level applied to the select line 215. Trace 546 might represent a voltage level of a sense enable signal. It is recognized that the sense operation of FIG. 5A might have more than one target memory cell, and may include a memory cell 208 connected to the selected access line 202 for each NAND string 206 or some subset thereof.

At time t0, a precharge phase might begin. The precharge phase of the sense operation might bring the unselected access lines 202 to a voltage level sufficient to activate their respective connected memory cells regardless of their data states, e.g., a pass voltage. As shown in the example of FIG. 5A, the voltage levels of all access lines 202 of the block of memory cells containing the target memory cell (e.g., one or more target memory cells) are initially brought up to a voltage level 552. The voltage level 552 may be sufficient to activate each memory cell connected to one of the access lines 202 regardless of their data state. As one example, voltage level 552 might be approximately 8 V. Bringing all of the access lines 202 up together in this manner may facilitate improvements in speed to steady state of any access line 202 whose desired voltage level is the voltage level 552. The select line 214 and the select line 215 might be brought up to a voltage level 554 sufficient to activate their respective select gates. The sense enable signal might normally have a logic high level indicating that sensing is disabled, and might be transitioned to a logic low level to enable sensing. The logic high level of the sense enable signal might correspond to a voltage level 548, which might be a supply voltage, such as Vcc. The logic low level of the sense enable signal might correspond to a voltage level 550, which might be a reference potential, e.g., Vss, ground or 0 V.

At or around time t1, the selected access line $202_x$ might be discharged to a voltage level $532_0$. The voltage level $532_0$ might represent a sense voltage (e.g., a verify voltage) intended to distinguish between possible data states of the target memory cell (e.g., during a program verify operation). For example, if the target memory cell is activated while the voltage level $532_0$ is applied to the access line $202_x$, and thus to the control gate of the target memory cell, it may be deemed to have a data state corresponding to a range of threshold voltages lower than or equal to the voltage level $532_0$. If the target memory cell is deactivated while the voltage level $532_0$ is applied to the access line $202_x$, it may be deemed to have a data state corresponding to a range of threshold voltages higher than the voltage level $532_0$. A sensing of a state of a data line to determine whether the target memory cell is activated might be performed (e.g., in response to the sense enable signal transitioning to a logic low level) at time t2a while the voltage level $532_0$ is being applied to the access line $202_x$, as is well understood in the art. As one example, the voltage level $532_0$ might correspond to a sense voltage intended to determine that the memory cell has the L0 data state if first activated in response to the voltage level $532_0$ after the precharge phase. Although the voltage level $532_0$ is depicted as being higher than the voltage level 550, one or more of the voltage levels $532_0$-$532_6$ might be negative voltage levels for some embodiments.

While the voltage level $532_0$ is being applied to the selected access line $202_x$ at time t2, the voltage level 552 might be applied to the unselected access lines $202_0$-$202_{x-1}$ and $202_{x+1}$-$202_N$. The voltage level 552 might be sufficient to activate the memory cells connected to these unselected access lines regardless of their data state. In addition, while the voltage level $532_0$ is being applied to the selected access line $202_x$ at time t2, the voltage level 554 might be applied to the select line 214 and to the select line 215. The voltage level 554 might be sufficient to activate the select gates connected to these select lines. In this manner, current flow may be established through the NAND string 206 if the target memory cell is activated, thus permitting sensing of its data state. As one example, the voltage level 554 might be approximately 5V.

At time t3, the voltage level applied to the selected access line $202_x$ might be increased to the voltage level $532_1$ while voltage levels of the other traces 542 and 544 might be maintained. The voltage level $532_1$ might represent a different sense voltage intended to distinguish between different possible data states of the target memory cell. A sensing of a state of a data line to determine whether the target memory cell is activated might be performed at time t3a while the voltage level $532_1$ is being applied to the access line $202_x$, as is well understood in the art. As one example, the voltage level $532_1$ might correspond to a sense voltage intended to determine that the memory cell has the L1 data state if first activated in response to the voltage level $532_1$ after the precharge phase.

At time t4, the voltage level applied to the selected access line $202_x$ might be increased to the voltage level $532_2$ while voltage levels of the other traces 542 and 544 might be maintained. The voltage level $532_2$ might represent a different sense voltage intended to distinguish between different possible data states of the target memory cell. A sensing of a state of a data line to determine whether the target memory cell is activated might be performed at time t4a while the voltage level $532_2$ is being applied to the access line $202_x$, as is well understood in the art. As one example, the voltage level $532_2$ might correspond to a sense voltage intended to determine that the memory cell has the L2 data state if first activated in response to the voltage level $532_2$ after the precharge phase.

At time t5, the voltage level applied to the selected access line $202_x$ might be increased to the voltage level $532_3$ while voltage levels of the other traces 542 and 544 might be maintained. The voltage level $532_3$ might represent a different sense voltage intended to distinguish between different possible data states of the target memory cell. A sensing of a state of a data line to determine whether the target memory cell is activated might be performed at time t5a while the voltage level $532_3$ is being applied to the access line $202_x$, as is well understood in the art. As one example, the voltage level $532_3$ might correspond to a sense voltage intended to determine that the memory cell has the L3 data state if first activated in response to the voltage level $532_3$ after the precharge phase.

At time t6, the voltage level applied to the selected access line $202_x$ might be increased to the voltage level $532_4$ while voltage levels of the other traces 542 and 544 might be maintained. The voltage level $532_4$ might represent a different sense voltage intended to distinguish between different possible data states of the target memory cell. A sensing of a state of a data line to determine whether the target memory cell is activated might be performed at time t6a while the voltage level $532_4$ is being applied to the access line $202_x$, as is well understood in the art. As one example, the voltage level $532_4$ might correspond to a sense voltage intended to determine that the memory cell has the L4 data state if first activated in response to the voltage level $532_4$ after the precharge phase.

At time t7, the voltage level applied to the selected access line $202_x$ might be increased to the voltage level $532_5$ while voltage levels of the other traces 542 and 544 might be maintained. The voltage level $532_5$ might represent a different sense voltage intended to distinguish between different possible data states of the target memory cell. A sensing of a state of a data line to determine whether the target memory cell is activated might be performed at time t7a while the voltage level $532_5$ is being applied to the access line $202_x$, as is well understood in the art. As one example, the voltage level $532_5$ might correspond to a sense voltage intended to determine that the memory cell has the L5 data state if first activated in response to the voltage level $532_5$ after the precharge phase.

At time t8, the voltage level applied to the selected access line $202_x$ might be increased to the voltage level $532_6$ while voltage levels of the other traces 542 and 544 might be maintained. The voltage level $532_6$ might represent a different sense voltage intended to distinguish between different possible data states of the target memory cell. A sensing of a state of a data line to determine whether the target memory cell is activated might be performed at time t8a while the voltage level $532_6$ is being applied to the access line $202_x$, as is well understood in the art. As one example, the voltage level $532_6$ might correspond to a sense voltage intended to determine that the memory cell has the L6 data state if first activated in response to the voltage level $532_6$ after the precharge phase. Memory cells that do not activate in response to any of the sense voltages $532_0$-$532_6$ might be deemed to have the data state L7.

While only seven sense voltages are depicted in FIG. 5A, other numbers of sense voltages might be used. In general, Y sense voltages might be used to distinguish between each of Y+1 possible data states. At time t9, the access lines and select lines might be discharged to the voltage level 550, while the sense enable signal might be allowed to return to its default voltage level 548.

While the sense operation of FIG. 5A was depicted to enable and disable sensing for each sense voltage 532 by toggling the sense enable signal 546 for each voltage 532, the sense operation of FIG. 5B might maintain the sense enable signal 546 at its logic low level while the voltage level applied to the selected access line is ramped. Like numbered elements in FIG. 5B correspond to the description as provided with respect to FIG. 5A. Likewise, the discussion of FIG. 5B will presume that the memory cell selected for the sense operation is the memory cell $208_x$ of the NAND string $206_0$. It is recognized that the sense operation of FIG. 5B might have more than one target memory cell, and may include a memory cell 208 connected to the selected access line 202 for each NAND string 206 or some subset thereof.

At time t0, a precharge phase might begin. The precharge phase of the sense operation might bring the unselected access lines 202 to a voltage level sufficient to activate their respective connected memory cells regardless of their data states, e.g., a pass voltage. As shown in the example of FIG. 5B, the voltage levels of all access lines 202 of the block of memory cells containing the target memory cell (e.g., one or more target memory cells) are initially brought up to a voltage level 552. The voltage level 552 may be sufficient to activate each memory cell connected to one of the access lines 202 regardless of their data state. As one example, voltage level 552 might be approximately 8V. Bringing all of the access lines 202 up together in this manner may facilitate improvements in speed to steady state of any access line 202 whose desired voltage level is the voltage level 552. The select line 214 and the select line 215 might be brought up to a voltage level 554 sufficient to activate their respective select gates. The sense enable signal might normally have a logic high level indicating that sensing is disabled, and might be transitioned to a logic low level to enable sensing.

At or around time t1, the selected access line $202_x$ might be discharged to a voltage level $533_0$. The voltage level $533_0$ might represent a sense voltage (e.g., a read voltage) intended to distinguish between possible data states of the target memory cell (e.g., during a read operation). For example, if the target memory cell is activated while the voltage level $533_0$ is applied to the access line $202_x$, and thus to the control gate of the target memory cell, it may be deemed to have a data state corresponding to a range of threshold voltages lower than or equal to the voltage level $533_0$. If the target memory cell is deactivated while the voltage level $533_0$ is applied to the access line $202_x$, it may be deemed to have a data state corresponding to a range of threshold voltages higher than the voltage level $533_0$. A sensing of a state of a data line to determine whether the target memory cell is activated might begin (e.g., in response to the sense enable signal transitioning to a logic low level) at time t3 while the voltage level $533_0$ is being applied to the access line $202_x$, as is well understood in the art. As one example, the voltage level $533_0$ might correspond to a sense voltage intended to determine that the memory cell has the L0 data state if first activated in response to the voltage level $533_0$ after the precharge phase. Although the voltage level $533_0$ is depicted as being higher than the voltage level 550, the voltage level $533_0$ might be a negative voltage level for some embodiments.

At time t3a, the voltage level of the selected access line might begin to ramp toward the voltage level $533_1$ while the sense enable signal remains at the voltage level 550, e.g., indicating that sensing is enabled. As the voltage level of the selected access line is increased, determinations of additional data states might be made between time t3 a and time t4, when the ramped sense voltage reaches the voltage level $533_1$. Due to the RC lag of the selected access line, the voltage level $533_1$ might be higher than the voltage level $532_6$ of FIG. 5A in order for memory cells at the far end of the selected access line to experience the voltage level $532_6$ at their control gates while the voltage level is ramping. Memory cells that do not activate between times t3 and t4 might be deemed to have the data state L7. Generation of the voltage ramp of the trace 540 between time t3a and time t4, and the resulting determination of data states, will be discussed in more detail with reference to FIGS. 6-8. At time t5, the access lines and select lines might be discharged to the voltage level 550, while the sense enable signal might be allowed to return to its default voltage level 548.

Figure 6:
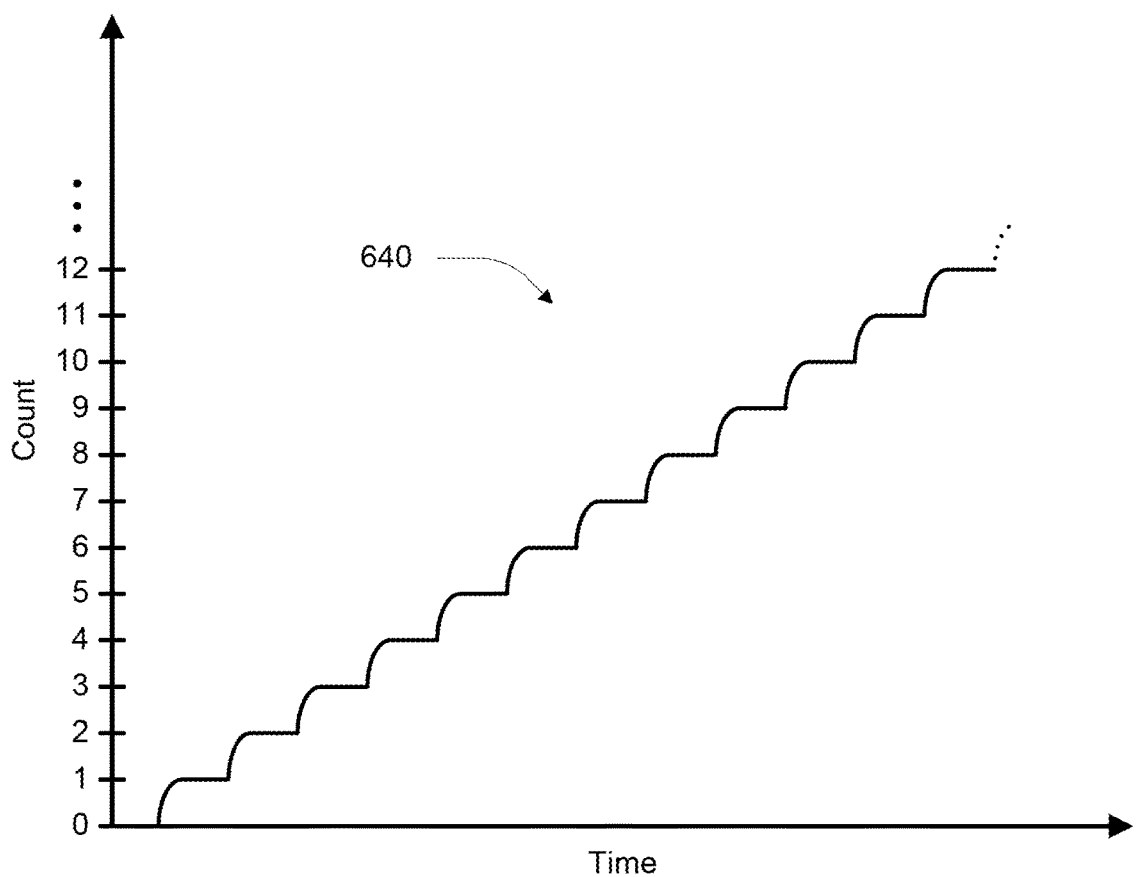
FIG. 6 is a depiction of an increasing voltage level for use with various embodiments.

FIG. 6 is a depiction of an increasing voltage level 640 for use with various embodiments. Various embodiments might use an increasing voltage level applied to access lines (e.g., each access line) during a precharge phase of a read operation, and might use an increasing voltage level applied to a selected access line during a sensing phase of the read operation. The increasing voltage level 640 might be responsive to a count. For example, as values of the counts increase, the voltage level of the increasing voltage level 640 might increase in response. The increasing voltage level 640 may approximate, or more closely approximate, a linear response by increasing the number of counts used to generate a same ranges of voltage levels. Although the increasing voltage level 640 depicts discrete steps for different count values, such a voltage trace for a ramped sensing such as depicted in FIG. 5B will be deemed herein to be a ramped voltage, and not a stepped voltage, when a length of a step is at least one order of magnitude smaller than a length of a step used for stepped sensing such as depicted in FIG. 5A. For example, each sense voltage 432 of FIG. 5A might be held for 20 μs in a typical stepped sensing scheme, and the counter 642 might advance every 280 ns in a typical ramped sensing scheme.

Figure 7:
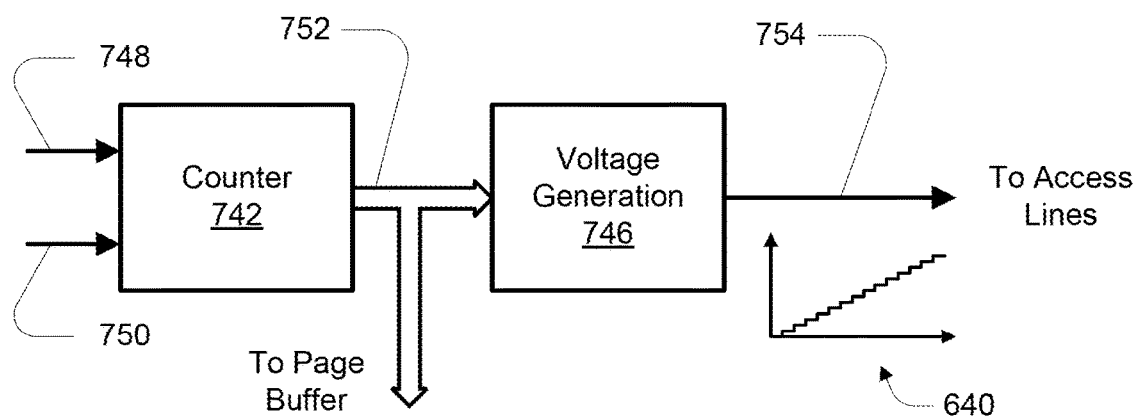
FIG. 7 is a block diagram of a voltage generation system for generating an increasing voltage level of the type depicted in FIG. 6 for use with various embodiments.

FIG. 7 is a block diagram of a voltage generation system for generating an increasing voltage level (e.g., a ramped voltage) of the type depicted in FIG. 5B for use with various embodiments. The voltage generation system of the type depicted in FIG. 7 might also be utilized for generation of other voltage levels of traces 540 and 542, in FIG. 5A and/or FIG. 5B.

The voltage generation system of FIG. 7 includes a counter 742 for producing a count. As an example, the counter 742 may have an output 752 for providing a bit pattern representative of the count. The counter 742 may be configured to receive an enable signal 748 to selectively enable or disable the counter, e.g., to hold the counter 742 at a last or other particular count. The counter 742 may further be configured to receive a reset signal 750 to reset a value of its count to an initial value, e.g., zero.

A voltage generation circuit 746, e.g., a digital-to-analog converter (DAC), might produce an analog voltage level responsive to the output 752 of the counter 742, e.g., responsive to the count. For use in the generation of discrete voltage levels, rather than a ramped voltage, the voltage generation circuit 746 might alternatively be responsive to a value received from an internal controller, e.g., the control logic 116. Regardless of its input, the DAC 746 might provide a corresponding voltage level at the output 754. The output 754 of the DAC 746 might be connected (e.g., selectively connected) to access lines (e.g., one or more access lines) of an array of memory cells. For example, the output 754 of the DAC 746 might be selectively connected to one or more access lines 202 of FIGS. 2A-2C. The output 752 of the counter 742 might also be connected (e.g., selectively connected) to a page buffer of a memory, such as a portion of a data register 120 of FIG. 1. Multiple voltage generation systems might be used to provide differing voltage levels to different access lines.

Figure 8:
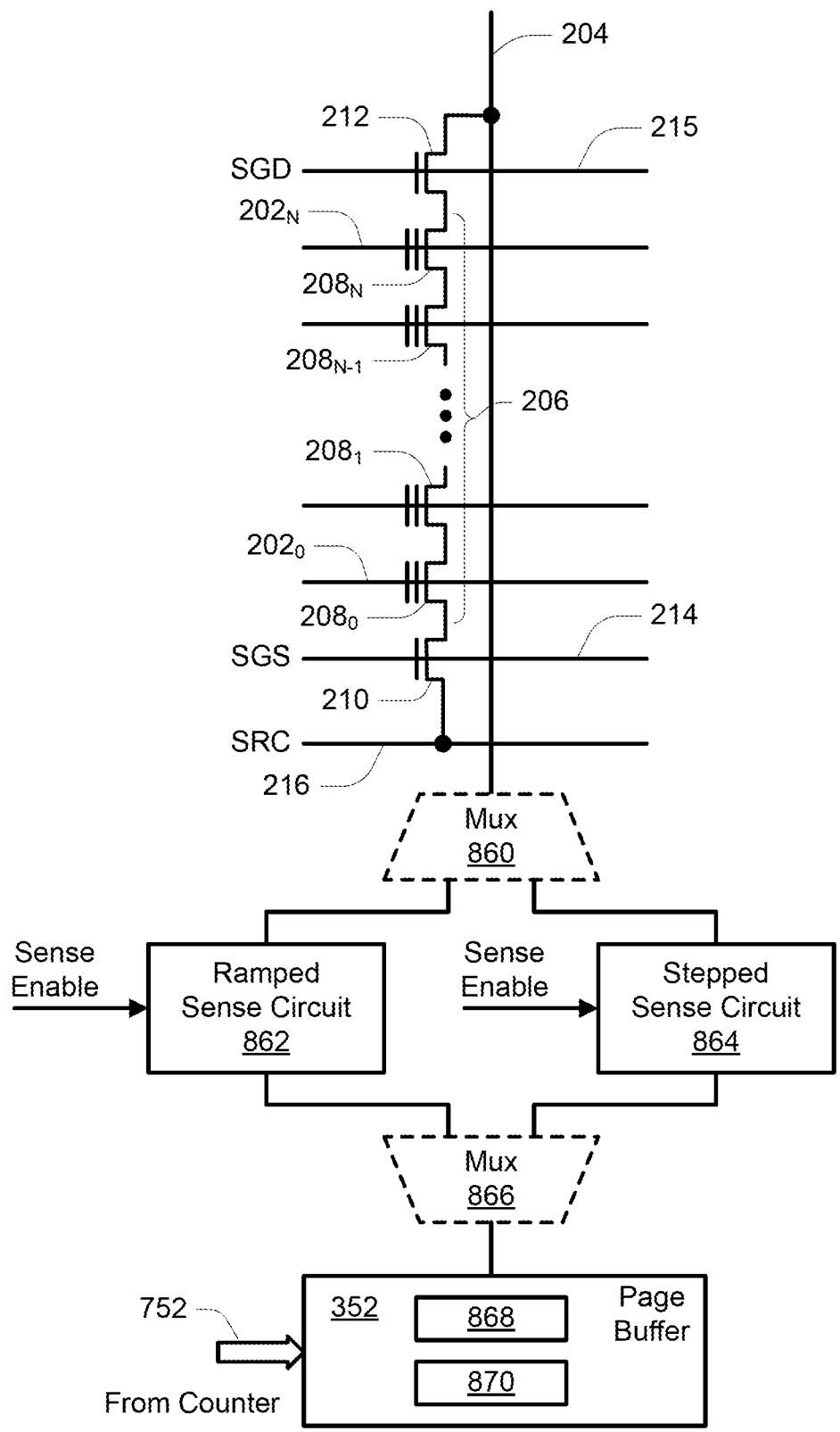
FIG. 8 is a block schematic depicting a connection of a data line to sensing devices and a page buffer for use with various embodiments.

FIG. 8 is a block schematic depicting a connection of a data line to sensing devices and a page buffer for use with various embodiments. In FIG. 8, a NAND string 206 is selectively connected to a data line 204 through a select gate 212, and to a source 216 through a select gate 210. The NAND string 206 might have the same structure as described with reference to FIG. 2A, having N+1 memory cells $208_0$-$208_N$. In sensing the data state of one of the memory cells $208_0$-$208_N$, the select gates 210 and 212 might be activated, a sense voltage might be applied to the access line (e.g., selected access line) connected to a memory cell selected for the sense operation, e.g., a target memory cell, and a pass voltage might be applied to the access lines (e.g., unselected access lines) connected to each remaining memory cell of the NAND string 206. For example, if the memory cell $208_1$ is selected for the sense operation, it might receive the sense voltage at its control gate, where that sense voltage is configured to activate the memory cell $208_1$ if its data state corresponds to a threshold voltage that is lower than or equal to the sense voltage, and to deactivate the memory cell $208_1$ if its data state corresponds to a threshold voltage that is higher than the sense voltage. Each remaining memory cell 208 (e.g., memory cells $208_0$ and $208_2$-$208_N$) might receive the pass voltage at their control gates, where that pass voltage is configured to activate each of the remaining memory cells 208 regardless of their data state.

The data line 204 might be connected to an optional multiplexer 860 to selectively connect the data line either to a ramped sense circuit 862 for performing a ramped sensing of the target memory cell, or to a stepped sense circuit 864 for performing a stepped sensing of the target memory cell. The nature of the sense circuits 862 and 864 for use with ramped or stepped sensing, respectively, are well understood in the art of semiconductor memory and will not be detailed herein. Each sense circuit 862 and 864 might be responsive to a respective sense enable signal to selectively enable or disable sensing. Alternatively, the data line 204 might be concurrently connected to both the ramped sense circuit 862 and the stepped sense circuit 864. For embodiments utilizing the multiplexer 860, the sense enable signal for the ramped sense circuit 862 might be the same as the sense enable signal for the stepped sense circuit 864. For embodiments concurrently connecting the ramped sense circuit 862 and the stepped sense circuit 864 to the data line 204, the sense enable signal for the ramped sense circuit 862 might be distinct from the sense enable signal for the stepped sense circuit 864. An optional multiplexer 866 might be connected between a page buffer 352 and the sense circuits 862 and 864 to selectively connect either the ramped sense circuit 862 or the stepped sense circuit 864 to the page buffer 352.

The state of the data line 204 might indicate whether the target memory cell $208_1$ is in a state of activation or deactivation as current flow between the data line 204 and the source 216 might be enabled or inhibited, respectively. This property can then be sensed by the corresponding enabled sense circuit 862 or 864 that is connected to the data line 204, such as through a measurement of current flow or a resulting voltage level, or a comparison of current flow or resulting voltage level to some threshold value, e.g., using a differential amplifier or the like. The output of the corresponding enabled sense circuit 862 or 864 that is connected to the data line 204 might be used to set one or more registers of a page buffer 352. For example, a first register 868 might be a one-digit (e.g., one bit) register having a first value (e.g., first logic level) indicative of the target memory cell $208_1$ being deactivated, e.g., in response to a sensing by the corresponding enabled sense circuit 862 or 864 that is connected to the data line 204 indicating that current flow between the data line 204 and the source 216 is inhibited. The register 868 might further have a second value (e.g., second logic level different than the first logic level) indicative of the target memory cell 208₁ being activated, e.g., in response to a sensing by the corresponding enabled sense circuit 862 or 864 that is connected to the data line 204 indicating that current flow between the data line 204 and the source 216 is enabled.

Relevant to ramped sensing, the page buffer 352 might further include a second register 870 that might be a multi-digit (e.g., multi-bit) register. In response to a sensing by the ramped sensing device 862 connected to the data line 204 indicating that current flow between the data line 204 and the source 216 is enabled, the page buffer 352 might be configured (e.g., in response to toggling the value of the first register 868 to its second value) to latch a representation of the count from the output 752 of the counter 742 into the register 870. In this manner, the register 870 might contain a representation of a determined threshold voltage of the target memory cell 208₁, e.g., a representation of the voltage level applied to the selected access line at a time when the state of the data line 204 changed.

Figure 9:
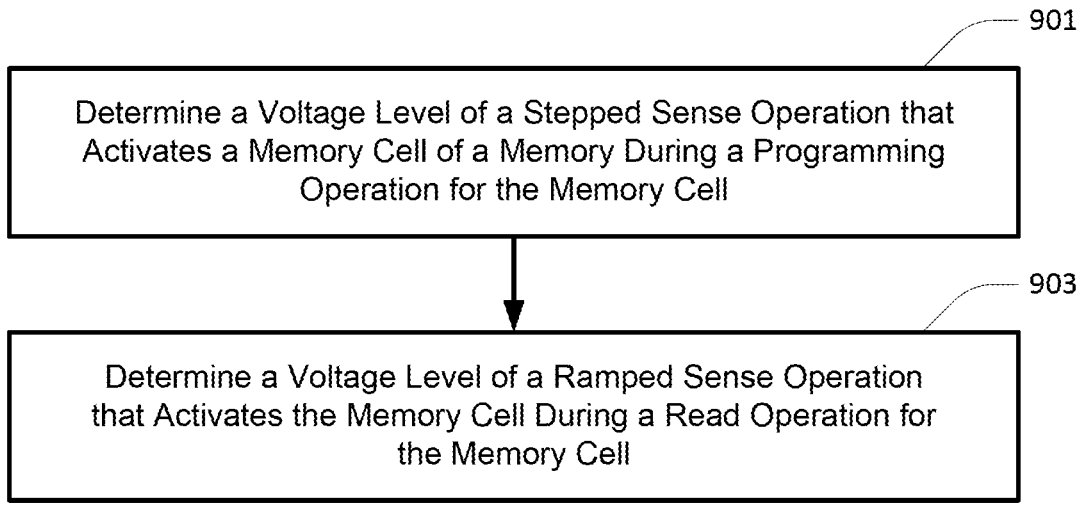
FIG. 9 is a method of operating a memory in accordance with an embodiment.

FIG. 9 is a method of operating a memory in accordance with an embodiment. The method of FIG. 9 might be performed during normal operation of the memory device. At 901, a voltage level of a stepped sense operation that activates the memory cell is determined during a programming operation for the memory cell. For example, the determined voltage level might be the voltage level being applied to the particular access line when a sense circuit for the stepped sense operation indicates a change of state of the data line connected to the memory cell. At 903, a voltage level of a ramped sense operation that activates the memory cell is determined during a read operation for the memory cell. For example, the determined voltage level might be the voltage level being applied to the particular access line when a sense circuit for the ramped sense operation indicates a change of state of the data line connected to the memory cell.

Figure 10:
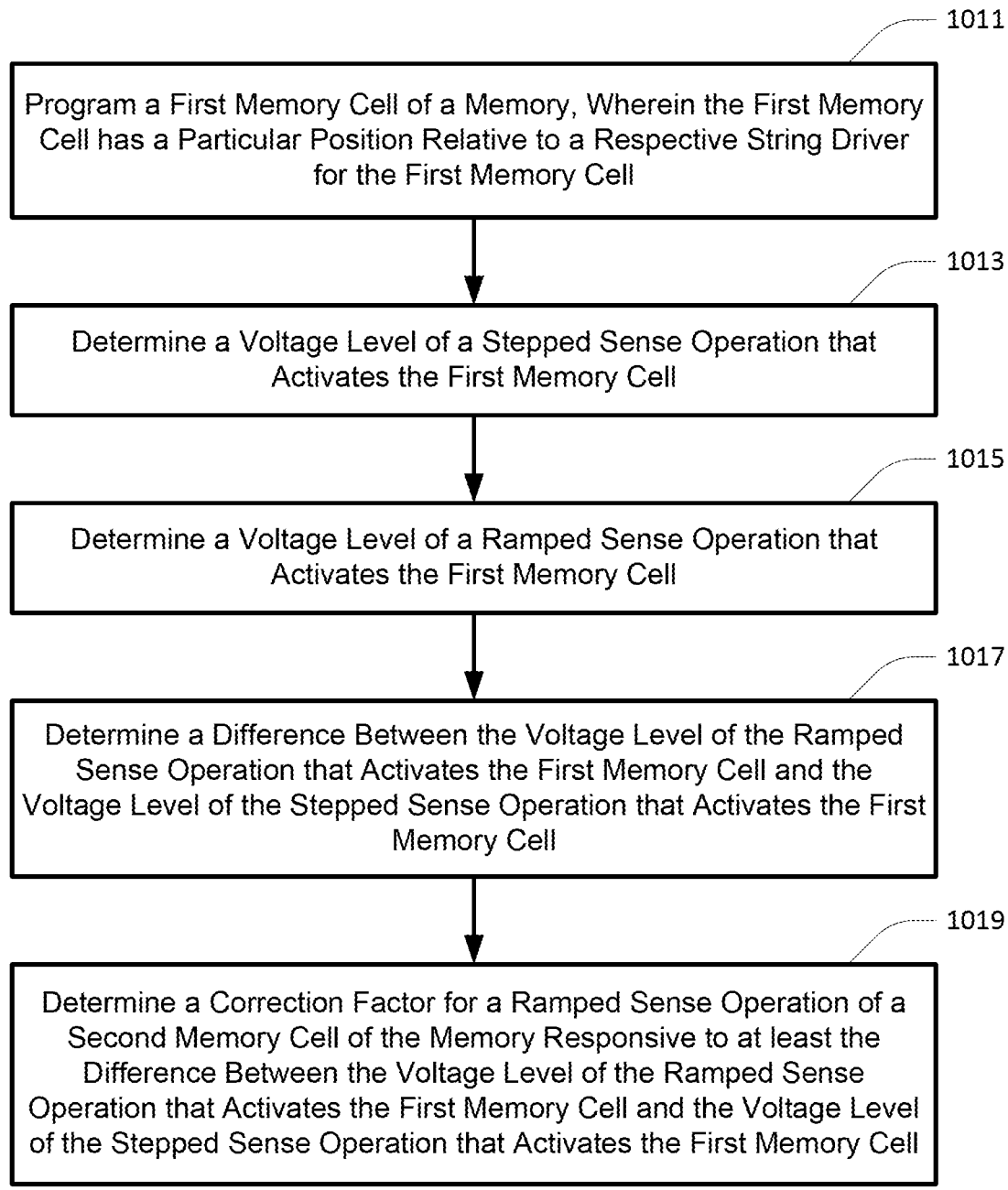
FIG. 10 is a method of operating a memory in accordance with another embodiment.

FIG. 10 is a method of operating a memory in accordance with another embodiment. The method of FIG. 10 might be performed during testing of the memory device, e.g., during fabrication of the memory. Additionally, or alternatively, the method of FIG. 10 might be performed as a test mode subsequent to fabrication.

At 1011, a first memory cell of the memory is programmed. For example, the memory cell might be programmed to have a particular data state of a plurality of data states of a programming operation. For operation as a TLC memory, the plurality of data states might be eight data states. For operation as a QLC memory, the plurality of data states might be sixteen data states. Other memory cells might also be programmed concurrently with the first memory cell. For example, the first memory cell might be connected to a particular access line, and other memory cells connected to the particular access line might be programmed during a same programming operation as the first memory cell. For some embodiments, the programming operation might use a stepped sense operation to verify that the first memory cell, and any additional memory cells, have reached their respective data states. Where multiple memory cells are programmed, a pattern of data might be programmed to include one or more memory cells for each data state of the plurality of data states.

The first memory cell has a particular position relative to a respective string driver for the first memory cell. Where additional memory cells are programmed concurrently, these additional memory cells might have a same position or different positions relative to a same string driver. The position of the first memory cell, and any additional memory cells, is representative of a distance from the string driver. A position might correspond to a single memory cell, or it might correspond to multiple memory cells over a contiguous portion of the particular access line. For example, a position might correspond to one or more memory planes, or it might correspond to some subset of data lines of a memory plane. An address of the memory cell or a range of addresses containing the memory cell, might define its position. In particular, an address of a memory cell might can be used to identify a particular physical location within an array of memory cell, and its distance from its respective string driver would be easily derived from the physical layout of the circuitry of the memory.

At 1013, a voltage level of a stepped sense operation that activates the first memory cell is determined, e.g., subsequent to programming the first memory cell. For example, the determined voltage level might be the voltage level being applied to the particular access line when a sense circuit for the stepped sense operation indicates a change of state of the data line connected to the first memory cell. For embodiments utilizing a stepped sense operation to verify that the first memory cell, and any additional memory cells, have reached their respective data states, the stepped sense operation at 1013 might have a same number of steps, a lesser number of steps, or a greater number of steps. For example, it might be desired to provide higher granularity (e.g., a greater number of steps) in determining a threshold voltage of the first memory cell at 1013 than was used to program the first memory cell. Higher granularity might facilitate improvements in subsequent correction of threshold voltages determined during normal operation. Alternatively, a lower granularity (e.g., a lesser number of steps) might be used to simplify the method. For example, the first memory cell could be programmed to a particular data state (e.g., highest data state) of the plurality of data states, and a function of a subsequent correction factor might be presumed to have a linear relationship to a measured threshold voltage.

At 1015, a voltage level of a ramped sense operation that activates the first memory cell is determined. For example, the determined voltage level might be the voltage level being applied to the particular access line when a sense circuit for the ramped sense operation indicates a change of state of the data line connected to the first memory cell. The ramped sense operation at 1015 might be performed prior to performing the stepped sense operation at 1013.

At 1017, a difference between the voltage level of the ramped sense operation that activates the first memory cell and the voltage level of the stepped sense operation that activates the first memory cell is determined. At 1019, a correction factor for a ramped sense operation of a second memory cell is determined responsive to at least the difference between the voltage level of the ramped sense operation that activates the first memory cell and the voltage level of the stepped sense operation that activates the first memory cell. The correction factor might further be determined responsive to a difference between the different position and the particular position. The correction factor might further be determined responsive to a voltage level of the ramped sense operation of the second memory cell that activates the second memory cell.

Figure 11:
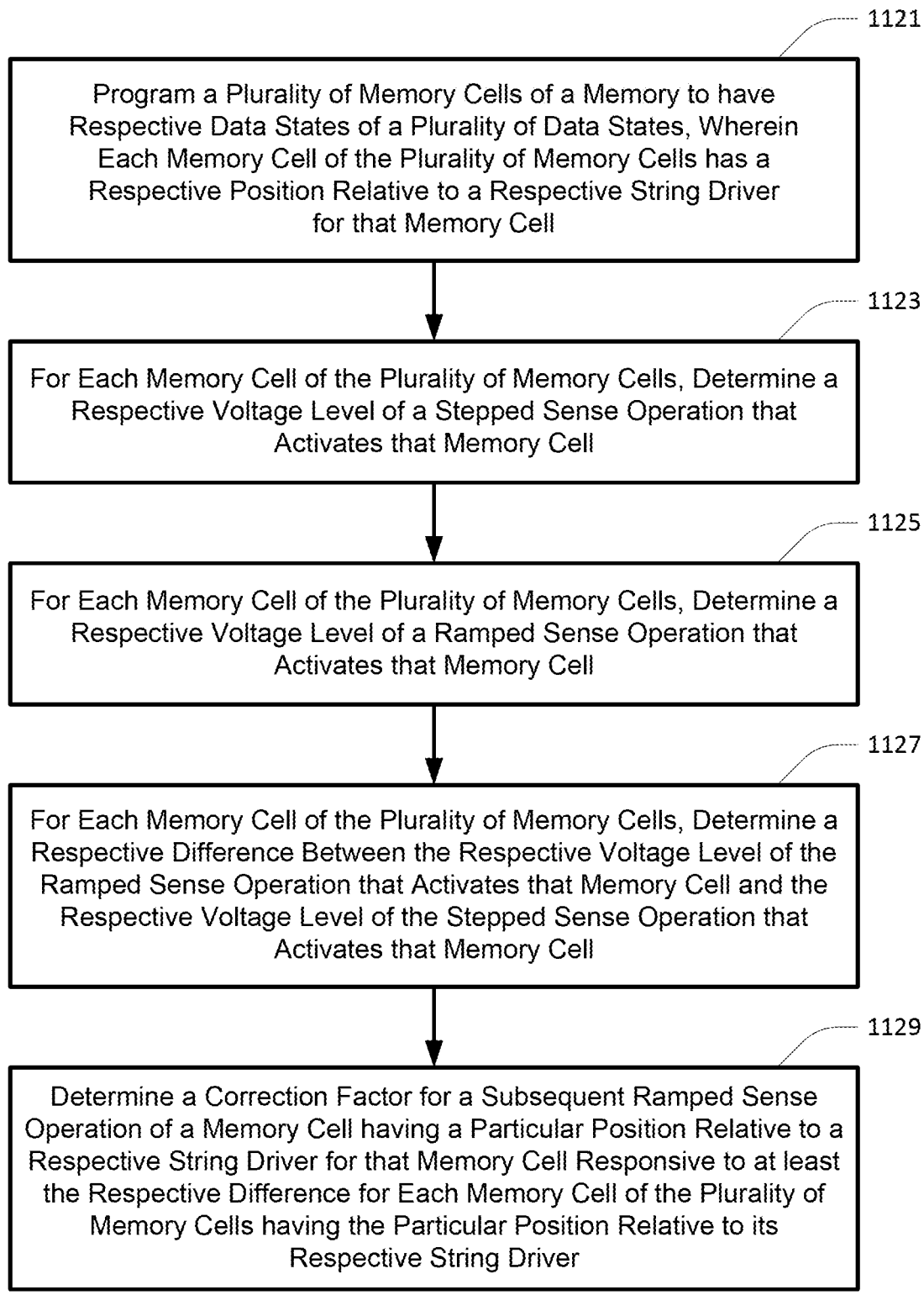
FIG. 11 is a method of operating a memory in accordance with a further embodiment.

FIG. 11 is a method of operating a memory in accordance with a further embodiment. The method of FIG. 11 might be performed during testing of the memory device, e.g., during fabrication of the memory. Additionally, or alternatively, the method of FIG. 11 might be performed as a test mode subsequent to fabrication.

At 1121, a plurality of memory cells of the memory are programmed to have respective data states of a plurality of data states of a programming operation. For operation as a TLC memory, the plurality of data states might be eight data states. For operation as a QLC memory, the plurality of data states might be sixteen data states. The plurality of memory cells might be all memory cell connected to a selected access line of one or more blocks of memory cells, or some subset of those memory cells. For some embodiments, the programming operation might use a stepped sense operation to verify that the plurality of memory cells have reached their respective data states. Programming the plurality of memory cells might involve programming the plurality of memory cells to include one or more memory cells for each data state of the plurality of data states.

Each memory cell of the plurality of memory cells has a respective position relative to a respective string driver for the first memory cell. The position of any memory cell of the plurality of memory cells is representative of a distance from the string driver relative to memory cells of the plurality of memory cells of different positons. A position might correspond to a single memory cell, or it might correspond to multiple memory cells over a contiguous portion of the selected access line. For example, a position might correspond to one or more memory planes, or it might correspond to some subset of data lines of a memory plane. Memory cells commonly selectively connected to a same data line will be deemed to have a same position relative to their respective string drivers. An address of the memory cell or a range of addresses containing the memory cell, might define its position. In particular, an address of a memory cell can be used to identify a particular physical location within an array of memory cell, and its distance from its respective string driver would be easily derived from the physical layout of the circuitry of the memory.

At 1123, for each memory cell of the plurality of memory cells, a voltage level of a stepped sense operation that activates that memory cell is determined. The stepped sense operation at 1123 might be performed subsequent to programming and verifying the plurality of memory cells. For example, the determined voltage level might be the voltage level being applied to the particular access line when a sense circuit for the stepped sense operation indicates a change of state of the data line connected to that memory cell. For embodiments utilizing a stepped sense operation to verify that the plurality of memory cells have reached their respective data states, the stepped sense operation at 1123 might have a same number of steps, a lesser number of steps, or a greater number of steps for reasons as discussed with reference to FIG. 10.

At 1125, for each memory cell of the plurality of memory cells, a voltage level of a ramped sense operation that activates that memory cell is determined. For example, the determined voltage level might be the voltage level being applied to the particular access line when a sense circuit for the ramped sense operation indicates a change of state of the data line connected to that memory cell. The ramped sense operation at 1125 might be performed prior to performing the stepped sense operation at 1123.

At 1127, for each memory cell of the plurality of memory cells, a difference between the voltage level of the ramped sense operation that activates that memory cell and the voltage level of the stepped sense operation that activates that memory cell is determined. At 1129, a correction factor for a subsequent ramped sense operation of a memory cell having a particular position relative to a respective string driver for that memory cell is determined responsive to at least the respective difference for each memory cell of the plurality of memory cells having the particular position relative to its respective string driver. The correction factor might be a function of a voltage level of the subsequent ramped sense operation that activates its memory cell. For example, the function might be an increasing function, such that higher voltage levels receive higher corrections. The correction factor further might be a function of a position of the memory cell of the subsequent ramped sense operation. For example, this function might be an increasing function, such that more distant positions receive higher corrections.

As one example, for each sense voltage of the stepped sense operation at 1123, and for each position, the respective differences between the voltage levels of the ramped sense operation at 1125 that activate memory cells having that position, and having that sense voltage of the stepped sense operation, might be plotted against the respective voltage levels of the ramped sense operation at 1125 that activate those memory cells having that position. A regression of this data could provide, for each position, a desired correction factor that is a function of the sensed voltage level of the ramped sense operation for that position. For positions other than positions used for the determination, interpolation could be used.

Figure 12:
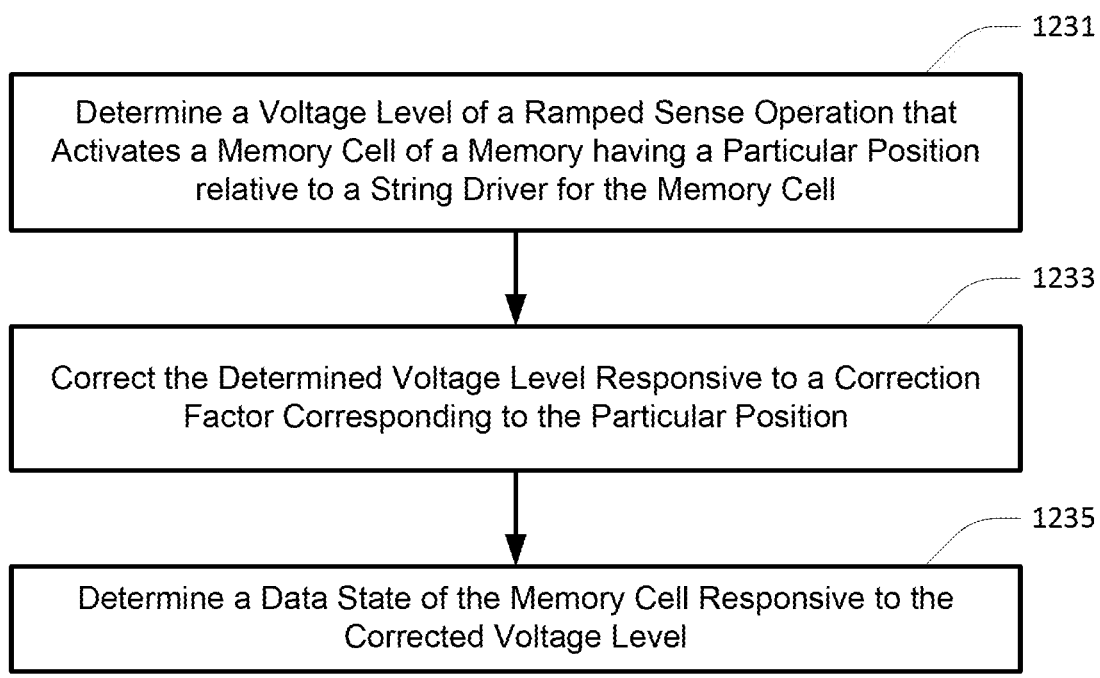
FIG. 12 is a method of operating a memory in accordance with a still further embodiment.

FIG. 12 is a method of operating a memory in accordance with a still further embodiment. The method of FIG. 12 might be performed during normal operation of the memory. At 1231, a voltage level of a ramped sense operation is determined to activate a memory cell of the memory. At 1233, the determined voltage level is corrected responsive to a correction factor corresponding to the particular position. The correction factor might further correspond to the determined voltage level. At 1235, a data state of the memory cell of a plurality of data states of the ramped sense operation is determined responsive to the corrected voltage level. For example, the corrected voltage level might be compared to predetermined (e.g., target) voltage levels for the different data states of the plurality of data states. Continuing with this example, if the corrected voltage level is lower than (or equal to) a voltage level corresponding to a particular data state of the plurality of data states, and higher than a voltage level corresponding to a next lower data state of the plurality of data states, the memory cell might be deemed to have the next lower data state. If the corrected voltage level is higher than a voltage level corresponding to a highest data state of the plurality of data states, the memory cell might be deemed to have the highest data state. And if the corrected voltage level is lower than (or equal to) a voltage level corresponding to a lowest data state of the plurality of data states, the memory cell might be deemed to have the lowest data state. The voltage levels corresponding to the plurality of data states might be the target verify voltages used for a program verify operation. Alternatively, the voltage levels corresponding to the plurality of data states might be the different than (e.g., lower than) the target verify voltages used for a program verify operation to compensate for expected charge loss of the memory cells.

Figure 13:
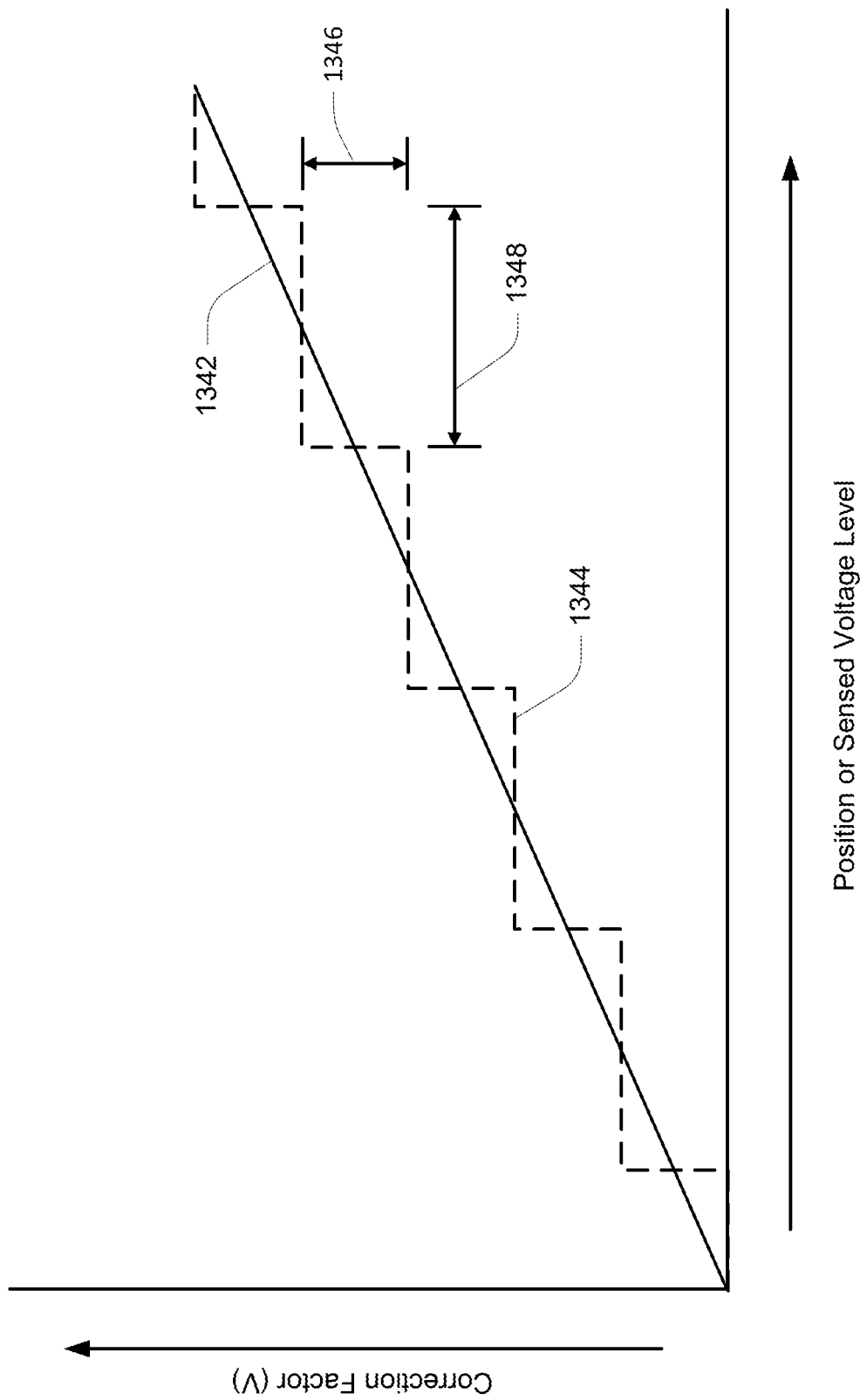
FIG. 13 depicts various increasing functions for use with embodiments.

FIG. 13 depicts various increasing functions for use with embodiments. Examples of some types of increasing functions of position or sensed voltage level are generally depicted in FIG. 13. Line 1342 represents a linear increasing function, e.g., having a constant positive slope. Line 1344 represents a stepped increasing function having successively higher steps as a value of the position (e.g., representative of distance from a string driver) or a sensed voltage level (e.g., of a ramped sense operation) is increased. Note that while steps of line 1344 are depicted to have equal height 1346 and equal length 1348, these values could be varied. For example, a particular step may have a greater height 1346 and lesser length 1348 than a preceding step, or it may have a lesser height 1346 and greater length 1348 than a preceding step. Stepped functions may represent the use of a look-up table, where the value of the correction factor is determined by looking up the value of the position or sensed voltage level in the table and selecting the value of the correction factor corresponding to that position or sensed voltage level. Table 3 is a conceptual example of a look-up table as a function of position. Alternatively, the value of the correction factor for an increasing function may be directly calculated from an equation of the increasing function, e.g., $Y=f(P)$, where P is the position of the sensed memory cell relative to its string driver. Similarly, the value of the correction factor for an increasing function may be directly calculated from an equation of the increasing function, e.g., $Y=f(P, V)$, where P is the position of the sensed memory cell relative to its string driver, and V is the sensed voltage level of the sensed memory cell.

TABLE 3

Correction factor Values (Y) as Function of Position (P)

| Position (P) | Correction factor Value (Y) |
|---|---|
| P1 | Y1 |
| P2 | Y2 |
| P3 | Y3 |
| P4 | Y4 |

While linear and stepped functions are described with reference to FIG. 13, other increasing functions of position can be used where a value of the correction factor for a particular sensed voltage level and a memory cell at a particular position is higher than the value of the correction factor for the particular sensed voltage level at each other position that is representative of a lesser distance from the string driver, and less than the value of the correction factor for the particular sensed voltage level at each other position that is representative of a greater distance from the string driver. Similarly, other increasing functions of sensed voltage level can be used where a value of the correction factor for a particular position and a particular sensed voltage level is higher than the value of the correction factor for the particular position at any sensed voltage level lower than the particular sensed voltage level, and less than the value of the correction factor for the particular position at any sensed voltage level higher than the particular sensed voltage level. While prior discussion provided a method of determining the increasing function experimentally, it might alternatively be determined empirically or through simulation.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the embodiments will be apparent to those of ordinary skill in the art. Accordingly, this application is intended to cover any adaptations or variations of the embodiments.

What is claimed is:

1. A method of operating a memory, comprising:
programming a first memory cell of the memory, wherein the first memory cell has a particular position relative to a respective string driver for the first memory cell;
determining a voltage level of a stepped sense operation that activates the first memory cell;
determining a voltage level of a ramped sense operation that activates the first memory cell;
determining a difference between the voltage level of the ramped sense operation that activates the first memory cell and the voltage level of the stepped sense operation that activates the first memory cell; and
determining a correction factor for a ramped sense operation of a second memory cell of the memory responsive to at least the difference between the voltage level of the ramped sense operation that activates the first memory cell and the voltage level of the stepped sense operation that activates the first memory cell.

2. The method of claim 1, wherein programming the first memory cell comprises programming a plurality of memory cells comprising the first memory cell.

3. The method of claim 2, wherein determining the voltage level of the stepped sense operation that activates the first memory cell comprises, for each memory cell of the plurality of memory cells, determining a respective voltage level of the stepped sense operation that activates that memory cell.

4. The method of claim 2, wherein determining the voltage level of the ramped sense operation that activates the first memory cell comprises, for each memory cell of the plurality of memory cells, determining a respective voltage level of the ramped sense operation that activates that memory cell.

5. The method of claim 1, wherein programming the first memory cell comprises verifying the programming of the first memory cell using a prior stepped sense operation.

6. The method of claim 5, wherein determining the voltage level of the stepped sense operation that activates the first memory cell comprises performing a stepped sense operation having a number of steps that is different than a number of steps of the prior stepped sense operation.

7. A method of operating a memory, comprising:
programming a plurality of memory cells of a memory to have respective data states of a plurality of data states, wherein each memory cell of the plurality of memory cells has a respective position relative to a respective string driver for that memory cell;
for each memory cell of the plurality of memory cells:
determining a respective voltage level of a stepped sense operation that activates that memory cell;
determining a respective voltage level of a ramped sense operation that activates that memory cell;
determining a respective difference between the respective voltage level of the ramped sense operation that activates that memory cell and the respective voltage level of the stepped sense operation that activates that memory cell; and
determining a correction factor for a subsequent ramped sense operation of a memory cell of the memory, having a particular position relative to a respective string driver for that memory cell, responsive to at least the respective difference for each memory cell of the plurality of memory cells having the particular position relative to its respective string driver.

8. The method of claim 7, wherein determining the correction factor comprises determining the correction factor as a function of a voltage level of the subsequent ramped sense operation that activates its memory cell.

9. The method of claim 7, wherein programming the plurality of memory cells to have respective data states of the plurality of data states comprises, for each data state of the plurality of data states, programming a respective subset of the plurality of memory cells to have that data state.

10. The method of claim 7, further comprising determining the respective voltage level of the ramped sense operation that activates a particular memory cell prior to determining the respective voltage level of the stepped sense operation that activates the particular memory cell.

11. The method of claim 7, wherein the stepped sense operation is a subsequent stepped sense operation, the method further comprising:
verifying that each memory cell of the plurality of memory cells has its respective data state using a prior stepped sense operation.

12. The method of claim 11, wherein using the prior stepped sense operation comprises using a stepped sense operation having a greater number of steps than a number of steps of the subsequent stepped sense operation.

13. The method of claim 7, wherein the method is performed during fabrication of the memory.

14. A method of operating a memory, comprising:
programming a first memory cell of the memory, wherein the first memory cell has a particular position relative to a respective string driver for the first memory cell;
after programming the first memory cell, determining a voltage level of a stepped sense operation that activates the first memory cell comprising sensing a state of a data line connected to the first memory cell using a first sense circuit;
after programming the first memory cell, determining a voltage level of a ramped sense operation that activates the first memory cell comprising sensing a state of the data line connected to the first memory cell using a second sense circuit different than the first sense circuit;
determining a difference between the voltage level of the ramped sense operation that activates the first memory cell and the voltage level of the stepped sense operation that activates the first memory cell; and
determining a correction factor for a ramped sense operation of a second memory cell of the memory responsive to at least the difference between the voltage level of the ramped sense operation that activates the first memory cell and the voltage level of the stepped sense operation that activates the first memory cell.

15. The method of claim 14, wherein determining the correction factor for the ramped sense operation of the second memory cell responsive to at least the difference between the voltage level of the ramped sense operation that activates the first memory cell and the voltage level of the stepped sense operation that activates the first memory cell further comprises determining the correction factor for the ramped sense operation of the second memory cell further responsive to the particular position of the first memory cell relative to the respective string driver for the first memory cell, and a position of the second memory cell relative to a respective string driver for the second memory cell.

16. The method of claim 14, wherein the stepped sense operation for the first memory cell comprises applying a first plurality of stepped voltage levels to a control gate of the first memory cell, wherein the ramped sense operation for the first memory cell comprises applying a second plurality of stepped voltage levels, having a greater number of steps than the first plurality of stepped voltage levels, to the control gate of the first memory cell, and wherein a length of each stepped voltage level of the second plurality of stepped voltage levels is at least one order of magnitude smaller than a length of each stepped voltage level of the first plurality of stepped voltage levels.

17. The method of claim 14, wherein the stepped sense operation for the first memory cell is a subsequent stepped sense operation, and wherein programming the first memory cell comprises performing one or more prior stepped sense operations using the first sense circuit to verify that the first memory cell has reached a desired data state of the programming.

18. The method of claim 17, wherein the one or more prior stepped sense operations for the first memory cell each comprise applying a first plurality of stepped voltage levels to a control gate of the first memory cell, wherein the subsequent stepped sense operation for the first memory cell comprises applying a second plurality of stepped voltage levels to the control gate of the first memory cell, and wherein a number of steps of the second plurality of stepped voltage levels is greater than a number of steps of the first plurality of stepped voltage levels.

19. The method of claim 14, wherein the particular position of the first memory cell relative to the string driver for the first memory cell corresponds to a first distance, and wherein a position of the second memory cell relative to a string driver for the second memory cell corresponds to a second distance, greater than the first distance, the method further comprising:
programming a third memory cell of the memory, wherein the third memory cell has a position relative to a respective string driver for the third memory cell that corresponds to a third distance, greater than the second distance;
after programming the third memory cell, determining a voltage level of a stepped sense operation that activates the third memory cell;
after programming the third memory cell, determining a voltage level of a ramped sense operation that activates the third memory cell; and
determining a difference between the voltage level of the ramped sense operation that activates the third memory cell and the voltage level of the stepped sense operation that activates the third memory cell;
wherein determining the correction factor for the ramped sense operation of the second memory cell comprises:
determining a first correction factor responsive to the difference between the voltage level of the ramped sense operation that activates the first memory cell and the voltage level of the stepped sense operation that activates the first memory cell;
determining a second correction factor responsive to the difference between the voltage level of the ramped sense operation that activates the third memory cell and the voltage level of the stepped sense operation that activates the third memory cell; and
determining the correction factor for the ramped sense operation of the second memory cell responsive to an interpolation between the first correction factor and the second correction factor.

20. The method of claim 14, further comprising determining the voltage level of the ramped sense operation that activates the first memory cell prior to determining the voltage level of the stepped sense operation that activates the first memory cell.

* * * * *